United States Patent
Hatano et al.

(10) Patent No.: US 9,576,831 B2
(45) Date of Patent: Feb. 21, 2017

(54) SUBSTRATE CONTAINER, A LOAD PORT APPARATUS, AND A SUBSTRATE TREATING APPARATUS

(71) Applicant: SCREEN Holdings Co., Ltd., Kyoto (JP)

(72) Inventors: Akito Hatano, Kyoto (JP); Koji Hashimoto, Kyoto (JP); Kazuhiro Honsho, Kyoto (JP); Mitsukazu Takahashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/843,144

(22) Filed: Sep. 2, 2015

(65) Prior Publication Data
US 2016/0071753 A1    Mar. 10, 2016

(30) Foreign Application Priority Data

Sep. 5, 2014 (JP) ................................. 2014-181103

(51) Int. Cl.
*A47G 19/08* (2006.01)
*H01L 21/673* (2006.01)
*H01L 21/677* (2006.01)

(52) U.S. Cl.
CPC ... *H01L 21/67383* (2013.01); *H01L 21/67346* (2013.01); *H01L 21/67369* (2013.01); *H01L 21/67772* (2013.01)

(58) Field of Classification Search
CPC ............... B65D 25/107; B65G 49/063; H01L 21/67369; H01L 21/67383; H01L 21/67346; H01L 21/67772; H01L 21/67373; H01L 21/67379; H01L 21/68; H01L 21/67635; H01L 21/67386; H01L 21/6732; H01L 21/67763; H01L 21/673; H01L 21/67769

(Continued)

(56) References Cited

U.S. PATENT DOCUMENTS

| 5,915,562 A | 6/1999 | Nyseth et al. ................. 206/710 |
| 6,098,809 A | 8/2000 | Okada et al. ................. 206/711 |

(Continued)

FOREIGN PATENT DOCUMENTS

| CN | 101447405 A | 6/2009 |
| CN | 203521389 U | 4/2014 |

(Continued)

OTHER PUBLICATIONS

Notice of Allowance dated Dec. 15, 2016 in corresponding Korean Patent Application No. 10-2015-0125656.

(Continued)

*Primary Examiner* — Jennifer E Novosad
(74) *Attorney, Agent, or Firm* — Ostrolenk Faber LLP

(57) ABSTRACT

A substrate container includes a housing, rack members, housing-side support members for supporting ends of substrates, a moving mechanism for moving the substrates, a lid, and lid-side support members for supporting ends of the substrates. The housing-side support members have deepest portions for supporting the ends of the substrates to be immovable upward. In a state where the lid is attached to the housing, the housing-side support members and lid-side support members clamp the ends of the substrates in between, with lower surfaces of the substrates out of contact with the rack members, and the housing-side support members support the ends of the substrates in the deepest portions. When the lid detaches from the housing, the moving mechanism moves the substrates supported in the deepest portions to disengage the ends of the substrates from the deepest portions, and places the substrates in a substantially horizontal position on the rack members.

16 Claims, 18 Drawing Sheets

(58) Field of Classification Search
USPC ..... 211/41.18; 206/454, 586, 710, 711, 833, 206/832, 712, 723, 591; 414/935, 936, 414/937, 938, 940, 941, 222.09
See application file for complete search history.

(56) References Cited

U.S. PATENT DOCUMENTS

| | | | | |
|---|---|---|---|---|
| 6,267,245 | B1* | 7/2001 | Bores | H01L 21/67369 206/454 |
| 6,591,987 | B2* | 7/2003 | Wu | H01L 21/67369 206/445 |
| 6,811,029 | B2* | 11/2004 | Eggum | H01L 21/67383 206/454 |
| 7,100,772 | B2* | 9/2006 | Burns | B65D 51/26 206/710 |
| 7,857,139 | B2* | 12/2010 | Contes | H01L 21/67369 206/710 |
| 7,922,000 | B2* | 4/2011 | Hyobu | H01L 21/67346 206/454 |
| 8,464,872 | B2* | 6/2013 | Inoue | H01L 21/67383 206/454 |
| 9,184,077 | B2* | 11/2015 | Yang | H01L 21/67369 |
| 2003/0010673 | A1* | 1/2003 | Duban-Hu | H01L 21/67383 206/711 |
| 2007/0295638 | A1* | 12/2007 | Nakatogawa | H01L 21/67369 206/711 |
| 2009/0142163 | A1 | 6/2009 | Genetti et al. | 414/217 |
| 2009/0143911 | A1 | 6/2009 | Gage et al. | 700/248 |
| 2011/0005868 | A1* | 1/2011 | Suzuki | H01L 21/67772 187/391 |
| 2011/0139675 | A1 | 6/2011 | Ku et al. | 206/711 |
| 2013/0037444 | A1 | 2/2013 | Inoue | 206/711 |
| 2014/0110959 | A1 | 4/2014 | Urabe et al. | 294/207 |
| 2014/0178162 | A1* | 6/2014 | Morikawa | H01L 21/67772 414/416.08 |
| 2015/0166227 | A1* | 6/2015 | Kuratsu | H01L 21/67772 220/260 |
| 2016/0071753 | A1* | 3/2016 | Hatano | H01L 21/67383 414/222.09 |

FOREIGN PATENT DOCUMENTS

| | | |
|---|---|---|
| JP | 10-233437 A | 9/1998 |
| JP | H11-91865 A | 4/1999 |
| JP | 2004-158808 A | 6/2004 |
| JP | 2007-227941 | 9/2007 |
| JP | 2014-86472 A | 5/2014 |
| KR | 10-1165611 B1 | 7/2012 |
| TW | 201226288 A1 | 7/2012 |

OTHER PUBLICATIONS

Office Action/Search Report dated Nov. 4, 2016 in corresponding Taiwan Patent Application No. 104128366.

* cited by examiner

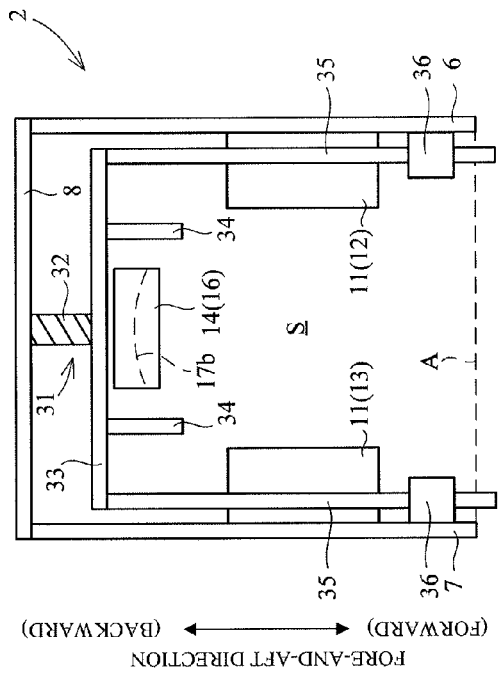
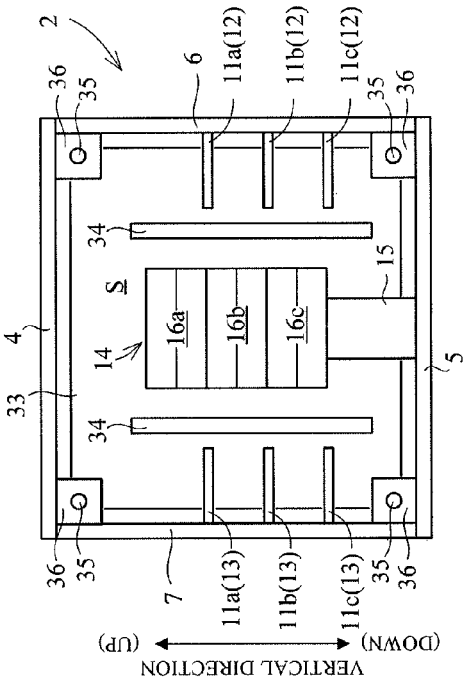
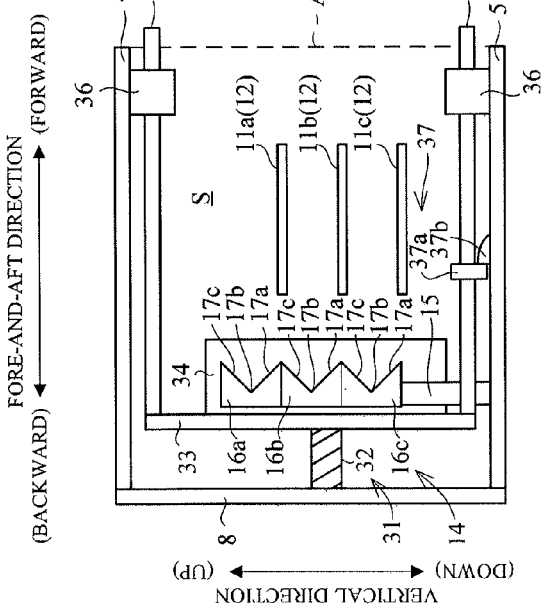

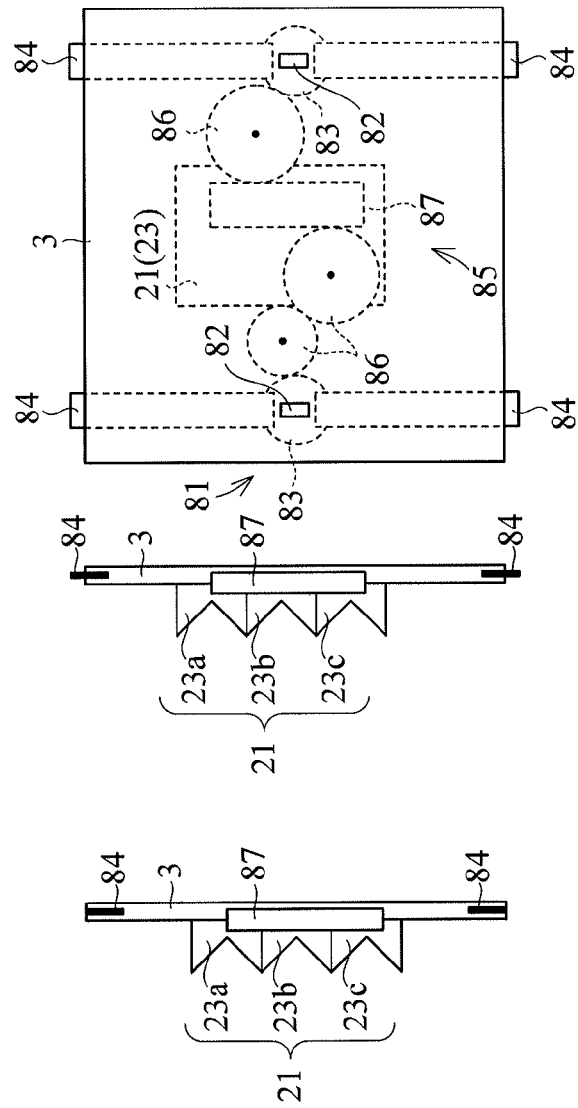

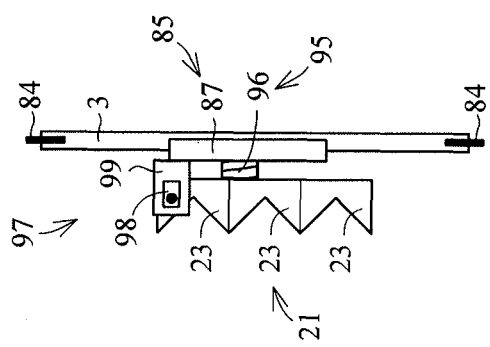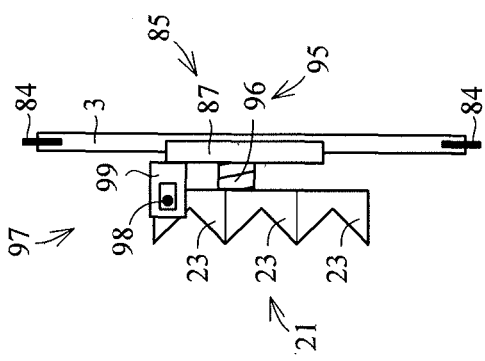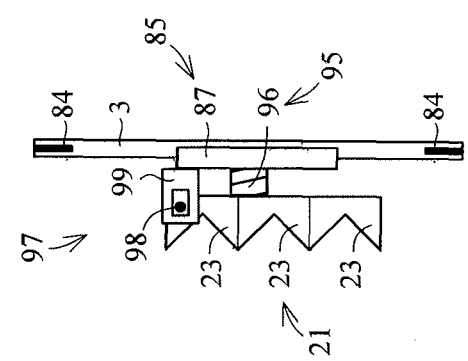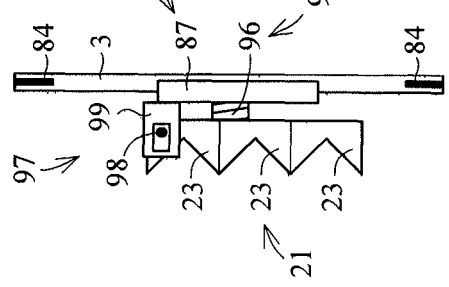

SUBSTRATE CONTAINER, A LOAD PORT APPARATUS, AND A SUBSTRATE TREATING APPARATUS

BACKGROUND OF THE INVENTION (1) Field of the Invention

This invention relates to a substrate container for containing semiconductor wafers, glass substrate for photomasks, glass substrates for liquid crystal displays, substrates for optical disks, and so on (hereinafter simply called "substrates"), and a load port apparatus and a substrate treating apparatus applicable to the substrate container.

(2) Description of the Related Art

Conventionally, there exists a substrate container which supports substrates in two modes (as disclosed in Japanese Unexamined Patent Publication No. 2007-227941, for example). This substrate container includes a housing, a lid, racks and cushions. The housing accommodates a plurality of substrates. The lid is attachable to and detachable from to the housing. The racks and cushions are arranged in the housing. The racks support the substrates in a state of lower surfaces of the substrates contacting the racks. The cushions hold the substrates in a state of the substrates being spaced from the racks and being stationary. Thus, the substrate container can support the substrates in a mode in which the racks support the substrates and a mode in which the cushions support the substrates.

When the lid is detached from the housing, the racks support the substrates. Consequently, an external transport mechanism provided outside the substrate container can unload the substrates from the substrate container and load the substrates into the substrate container. When the lid is attached to the housing, the cushions support the substrates. Consequently, the substrates can be protected conveniently when the substrate container is transported. Thus, the mode in which the racks support the substrates and the mode in which the cushions support the substrates are switched between each other by attachment and detachment of the lid to/from the housing.

However, Inventors herein have found out that the conventional example with such construction has the following drawbacks.

That is, even when the lid has separated from the housing, the cushions can remain holding the substrates and the substrates would not disengage from the cushions. Conceivable causes of this include scars formed on surfaces of the cushions, and abrasion powder resulting from abrasion between the cushions and substrates and having deposited on the cushions.

When the lid has separated from the substrate container and the substrates would not disengage from the cushions, the substrates cannot be placed properly on the racks and intervals between the substrates cannot be secured properly. It is therefore difficult for the external transport mechanism to advance into clearances between the substrates and unload the substrates from the substrate container. Also when the lid has separated from the substrate container and the substrates would not disengage from the cushions, movement of the substrates will remain restricted by the cushions. For example, the substrates become caught by the cushions to be unable to move easily. Consequently, it becomes difficult for the external transport mechanism to hold the substrates and unload the substrates from the substrate container.

SUMMARY OF THE INVENTION

This invention has been made having regard to the state of the art noted above, and its object is to provide a substrate container, a load port apparatus and a substrate treating apparatus which can appropriately permit unloading of substrates.

To fulfill the above object, this invention provides the following construction.

A substrate container according to this invention comprises:

a housing capable of accommodating substrates therein, and having an opening in a front plane thereof;

rack members arranged inside the housing for contacting lower surfaces of the substrates and supporting the substrates in a substantially horizontal position;

housing-side support members arranged inside the housing for supporting ends of the substrates;

a moving mechanism mounted inside the housing for moving the substrates;

a lid detachable from and attachable to the housing to open and close the opening; and lid-side support members attached to a rear surface of the lid for supporting ends of the substrates;

wherein:

the housing-side support members have binding portions for supporting the ends of the substrates to be immovable upward;

in a state where the lid is attached to the housing, the housing-side support members and the lid-side support members clamp the ends of the substrates in between, with the lower surfaces of the substrates out of contact with the rack members, and the housing-side support members support the ends of the substrates in the binding portions; and when the lid detaches from the housing, the moving mechanism moves the substrates supported in the binding portions to disengage the ends of the substrates from the binding portions, and places the substrates in the substantially horizontal position on the rack members.

In the state where the lid is attached to the housing, the housing-side support members and lid-side support members support the ends of the substrates, respectively. Especially the housing-side support members support the ends of the substrates in the binding portions. Consequently, the housing-side support members and lid-side support members clamp the substrates in between. In a state where the lid is detached from the housing, the rack members support the substrates.

When the lid separates from the housing, the moving mechanism moves the substrates supported in the binding portions. That is, the moving mechanism disengages the ends of the substrates from the binding portions. Consequently, the substrates become movable upward. Further, the moving mechanism places the substrates in the substantially horizontal position on the rack members. Consequently, clearances in the vertical direction between the substrates are secured appropriately. In the state where the lid is detached from the housing, therefore, a transport mechanism provided outside the substrate container can advance appropriately into the substrate container, for example, and can hold the substrates in the substrate container appropriately. Thus, the substrate container can appropriately permit unloading of the substrates from the substrate container.

The moving mechanism may, but need not, move the substrates not supported in the binding portions. Here, the "substrates not supported in the binding portions" are substrates having disengaged automatically (under their own weight) from the binding portions simultaneously with detachment of the lid.

The moving mechanism may continue contacting the substrates, but does not need to do so, until the substrates are placed in the substantially horizontal position on the rack members. That is, as long as the substrates can be placed in the substantially horizontal position on the rack members, the moving mechanism may separate from the substrates before the substrates are placed in the substantially horizontal position on the rack members.

Further, in a state where the lid is detached from the housing, the housing-side support members may have the parts thereof other than the binding portions in contact with the substrates, and the entirety of the housing-side support members may be separate from the substrates.

In the invention described above, the moving mechanism may include an elastically deformable elastic member; in the state where the lid is attached to the housing, the elastic member is elastically deformed for allowing the substrates to be supported in the binding portions; and when the lid detaches from the housing, the elastic member is restored to move the substrates. The moving mechanism having the elastic member does not require separately a mechanism for moving the substrates. Thus, the construction of the moving mechanism can be simplified and reduced in size.

In the invention described above, the moving mechanism may include link members for interlocking movement of the lid relative to the housing and elastic deformation of the elastic member. The link members operate the elastic member using movements of the lid at times of attachment and detachment. Thus, the construction of the moving mechanism can be further simplified and reduced in size.

In the invention described above, the elastic member may be capable of directly contacting the substrates. The construction of the moving mechanism can be further simplified.

In the invention described above, the moving mechanism may further include contact members connected to the elastic member to be capable of directly contacting the substrates. The contact members are separate members from the elastic member, and the elastic member does not directly contact the substrates. Thus, the substrates can be protected advantageously.

In the invention described above, the substrate container may comprise guide members for limiting a moving direction of the contact members to one direction. When the lid separates from the housing, the contact members can move the substrates appropriately. Consequently, the substrate container can permit unloading of the substrates with increased convenience.

In the invention described above, the substrate container may comprise a restricting member for specifying a movable range of the moving mechanism to fix a range in which the moving mechanism moves the substrates. The restricting member fixes the range in which the substrates are moved by the moving mechanism. Consequently, the position of the substrates when the lid has separated from the housing can be fixed. In other words, it can prevent variations in the position of the substrates occurring each time the lid separates from the housing. Consequently, the substrate container can permit unloading of the substrates with increased convenience.

In the invention described above, the moving mechanism may include a gas-operated device operable by gas supply and exhaust; a connection port connectable to an external device of the substrate container; and a gas flow path for connecting the gas-operated device and the connection port. The moving mechanism with the gas-operated device can control movement of the substrates in a meticulous way. The "external device" refers to a device installed outside the substrate container.

In the invention described above, the lid-side support members may be movable up and down relative to the lid. With the lid-side support members moving up and down relative to the lid, the lid-side support members can move the substrates up and down without relative sliding movement between the lid-side support members and substrates. This can inhibit particle generation between the substrates and lid-side support members.

In the invention described above, the substrate container may comprise a lid-side lift mechanism for moving the lid-side support members up and down relative to the lid. With the lid-side lift mechanism, the lid-side support members can be moved up and down effectively.

In the invention described above, the substrate container may comprise a lock mechanism for locking the lid to the housing; wherein the lid-side lift mechanism is interlocked to the lock mechanism to move the lid-side support members up and down relative to the lid in response to operation of the lock mechanism. The lid-side lift mechanism can move the lid-side support members up and down using operation of the lock mechanism. Thus, the construction of the lid-side lift mechanism can be simplified and reduced in size.

In the invention described above, the lid-side lift mechanism may be configured to move the lid-side support members up and down relative to the lid in response to motions of the lid attaching to and detaching from the housing. The lid-side lift mechanism can move the lid-side support members up and down using motions of the lid relative to the housing at times of attachment and detachment. Thus, the construction of the lid-side lift mechanism can be simplified and reduced in size.

In the invention described above, the lid-side support members may be substantially horizontally movable relative to the lid. In the state where the lid is attached to the housing, the housing-side support members and lid-side support members can clamp the substrates in between with increased effect.

In the invention described above, the lid-side support members may be formed of an elastic resin. The lid-side support members can properly hold the substrates with the housing-side support members.

In another aspect of this invention, a load port apparatus is provided which comprises:

a support table for receiving a substrate container placed thereon; and a lid opening and closing mechanism for opening and closing a lid of the substrate container placed on the support table;

the substrate container having:

a housing capable of accommodating substrates therein, and having an opening in a front plane thereof;

rack members arranged inside the housing for contacting lower surfaces of the substrates and supporting the substrates in a substantially horizontal position;

housing-side support members arranged inside the housing for supporting ends of the substrates;

a moving mechanism mounted inside the housing for moving the substrates a lid detachable from and attachable to the housing to open and close the opening; and lid-side support members attached to a rear surface of the lid for supporting ends of the substrates;

wherein:

the housing-side support members have binding portions for supporting the ends of the substrates to be immovable upward;

in a state where the lid is attached to the housing, the housing-side support members and the lid-side support members clamp the ends of the substrates in between, with the lower surfaces of the substrates out of contact with the rack members, and the housing-side support members support the ends of the substrates in the binding portions; and when the lid detaches from the housing, the moving mechanism moves the substrates supported in the binding portions to disengage the ends of the substrates from the binding portions, and places the substrates in the substantially horizontal position on the rack members.

With the load port apparatus according to this invention, the substrate container described above can be placed conveniently.

In a further aspect of this invention, a substrate treating apparatus is provided which comprises:

a support table for receiving a substrate container placed thereon;

a lid opening and closing mechanism for opening and closing a lid of the substrate container placed on the support table;

a treating unit for treating substrates; and a transport mechanism for unloading the substrates from the substrate container placed on the support table, and loading the substrates into the treating unit;

the substrate container having:

a housing capable of accommodating substrates therein, and having an opening in a front plane thereof;

rack members arranged inside the housing for contacting lower surfaces of the substrates and supporting the substrates in a substantially horizontal position;

housing-side support members arranged inside the housing for supporting ends of the substrates;

a moving mechanism mounted inside the housing for moving the substrates a lid detachable from and attachable to the housing to open and close the opening; and lid-side support members attached to a rear surface of the lid for supporting ends of the substrates;

wherein:

the housing-side support members have binding portions for supporting the ends of the substrates to be immovable upward;

in a state where the lid is attached to the housing, the housing-side support members and the lid-side support members clamp the ends of the substrates in between, with the lower surfaces of the substrates out of contact with the rack members, and the housing-side support members support the ends of the substrates in the binding portions; and when the lid detaches from the housing, the moving mechanism moves the substrates supported in the binding portions to disengage the ends of the substrates from the binding portions, and places the substrates in the substantially horizontal position on the rack members.

The substrate treating apparatus according to this invention can treat the substrates storable in the substrate container described above.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 2A is a plan view showing the interior of the housing;

FIG. 2B is a side view showing the interior of the housing;

FIG. 2C is a front view showing the interior of the housing;

FIGS. 10A and 10B are front views and side views showing a lid according to Embodiment 4;

FIGS. 15A, 15B, 15C and 15D are side views showing a lid according to a modified embodiment.

DESCRIPTION OF THE PREFERRED EMBODIMENTS

Embodiment 1

1. Construction of Substrate Container

Figure 1A:
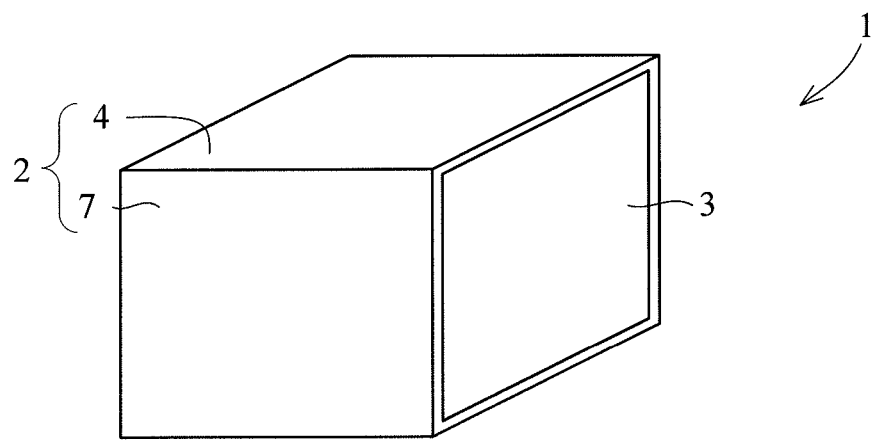
FIG. 1A is a perspective view showing an outward appearance of a substrate container when a lid is attached to a housing.
Figure 1B:
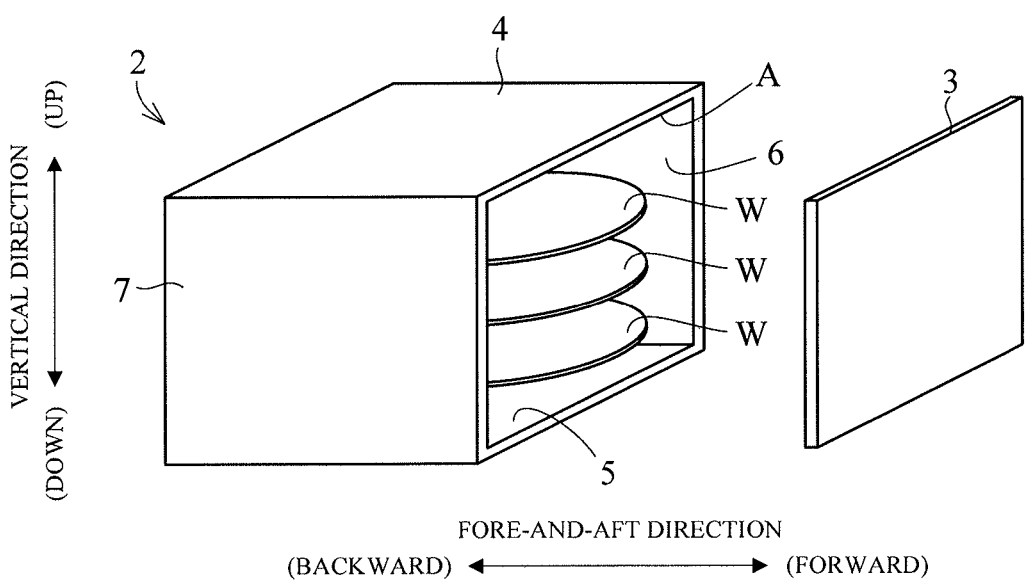
FIG. 1B is a perspective view showing an outward appearance of the substrate container when the lid is not attached to the housing.

Referring to FIGS. 1A and 1B, a substrate container 1 has an outer configuration that is a substantially rectangular parallelepiped. The substrate container 1 can accommodate a plurality of wafers W. The "wafers W" are semiconductor wafers, glass substrates for photomasks, glass substrates for liquid crystal displays, substrates for plasma displays, substrates for optical disks, substrates for magnetic disks, or substrates for magneto-optical disks, for example.

The substrate container 1 includes a housing 2 and a lid 3. The lid 3 is attached to a front plane of the housing 2. An opening A is formed in the front plane of the housing 2 as shown in FIG. 1B. The lid 3 closes the opening A. The opening A is a substantially vertical virtual plane. When the lid 3 attaches to or detaches from the housing 2, the lid 3, while facing the opening A, moves in a fore-and-aft direction substantially perpendicular to the opening A. The fore-and-aft direction is substantially horizontal. A space S for accommodating wafers W is formed inside the housing 2 (see FIG. 2). The substrate container 1 is constructed to store at least one wafer W. Typically the substrate container 1 stores 25 wafers W. For expediency of the description to follow, the substrate container 1 is assumed to have a capacity for up to three wafers W, for example.

Reference is made to FIGS. 2A through 2C in addition to FIGS. 1A and 1B. The housing 2 has a top plate 4, a bottom plate 5, a right wall 6, a left wall 7 and a rear wall 8. These parts 4 through 8 define the space S noted above. For expediency of illustration, FIG. 2A omits the top plate 4 and bottom plate 5. FIG. 2B omits the right wall 6 and left wall 7. FIG. 2C omits the rear wall 8.

In the following description, of the fore-and-aft directions, the direction from the rear wall 8 toward the opening A will be called "forward" as appropriate, and the direction opposite to forward "backward".

The housing 2 includes rack members 11a, 11b and 11c arranged therein. The rack members 11a, 11b and 11c are arranged in the vertical direction to be one above the other. The rack members 11a, 11b and 11c each receive one wafer W. Each of the rack members 11a, 11b and 11c supports the wafer W in a substantially horizontal position from below. Each rack member 11a, 11b or 11c contacts a lower surface of the wafer W. In this specification, the "lower surface of the wafer W" is a concept that includes lower edges of the wafer W. The contact between each rack member 11a, 11b or 11c and the wafer W is limited to the lower surface of the wafer W. Therefore, each rack member 11a, 11b or 11c, when supporting the wafer W, permits upward movement of the wafer W. The wafers W on the rack members 11a, 11b and 11c are arranged in the vertical direction. In the following description, the rack members 11a, 11b and 11c, when not particularly distinguished, will simply be called the "rack member(s) 11". As described hereinafter, a holding arm 47a provided outside the substrate container 1 loads a wafer W on each rack member 11, and unloads a wafer from each rack member 11. When loading a wafer W, the holding arm 47a places the wafer W on each rack member 11 by advancing to a position over each rack member 11 and then moving slightly down. When unloading a wafer W, the holding arm 47a holds the wafer W placed on each rack member 11 by advancing to a position under each rack member 11 and then moving slightly up (see FIGS. 4A and 4B). For this purpose, clearances are provided above and below each rack member 11 for allowing the holding arm 47a to make advances safely (e.g. for allowing the holding arm 47a to make advances without colliding with the wafer W or rack member 11). Intervals in the vertical direction between the rack members 11 are set to enable safe advances of the holding arm 47a.

In this embodiment, each rack member 11 includes a right rack member 12 and a left rack member 13. The right rack member 12 and left rack member 13 are separated from each other. The right rack member 12 cantilevers from the right wall 6, and the left rack member 13 from the left wall 7.

The housing 2 further includes a housing-side support block 14 disposed therein. The housing-side support block 14 is connected to the housing 2 through an anchor arm 15. The housing-side support block 14 has housing-side support members 16a, 16b and 16c formed thereon. The housing-side support members 16a, 16b and 16c are arranged in the vertical direction to be one above the other. Each of the housing-side support members 16a, 16b and 16c supports an end of a wafer W. More particularly, each housing-side support member 16a, 16b or 16c supports an end of a rear portion of a wafer W. Here, the "rear portion of a wafer W" is a portion of the wafer W close to the rear wall 8. A portion of a wafer W in the housing 2 located close to the opening A is called the "front portion of a wafer W" as appropriate. In the following description, the housing-side support members 16a, 16b and 16c, when not particularly distinguished, will simply be called the "housing-side support member(s) 16".

The material of the housing-side support members 16 is a resin, for example. Each housing-side support member 16 has one groove 17 formed therein. As shown in FIG. 2B, the groove 17 is recessed backward. The groove 17, when seen from a side, is in the shape of letter "V" turned sideways, for example.

The groove 17 has a lower slope 17a, a deepest portion 17b and an upper slope 17c. The lower slope 17a lies adjacent to and downward of the deepest portion 17b, while the upper slope 17c lies adjacent to and upward of the deepest portion 17b.

A height relationship between housing-side support member 16 and rack member 11 will be described here. The position of the deepest portion 17b of the housing-side support member 16a is higher than a plane of contact of the rack member 11a. The lower end of the lower slope 17a of the housing-side support member 16a is on a level with or lower than the plane of contact of the rack member 11a. Here, the "plane of contact" is a plane of contact with a wafer W, which is, for example, an upper plane of the rack member 11. The height relationship between housing-side support member 16b and rack member 11b, and that between housing-side support member 16c and rack member 11c, are the same as that between housing-side support member 16a and rack member 11a.

The substrate container 1 further includes a moving mechanism 31. The moving mechanism 31 is mounted inside the housing 2. The moving mechanism 31 has a spring 32, a movable plate 33, pushers 34 and rods 35.

The spring 32 is a compression spring, for example. One end of the spring 32 is fixed to the rear wall 8 of the housing 2, and the other end of the spring 32 is connected to the movable plate 33. When the spring 32 deforms under compressive force, the spring 32 will store restoring force. The restoring force of the spring 32 presses the movable plate 33 forward. That is, the spring 32 in a state of being deformed by compressive force, presses the movable plate 33 forward. The spring 32 is an example of the elastic member in this invention.

The movable plate 33 has two pushers 34 and four rods 35 attached thereto. The movable plate 33, pushers 34 and rods 35 are movable together. Each pusher 34 projects forward from the movable plate 33. One pusher 34 is disposed rightward of the housing-side support members 16, and the other pusher 34 leftward of the housing-side support members 16. A forward end of each pusher 34 is disposed to be capable of directly contacting the wafers W. In this embodiment, the forward end of each pusher 34 contacts a plurality of wafers W all together. The forward end of each pusher 34 extends parallel to the vertical direction. The forward end of each pusher 34 therefore contacts the wafers W in the same position in plan view. Each rod 35 extends forward from the movable plate 33. Each rod 35 has an axis thereof extending parallel to the fore-and-aft direction. A front end of each rod 35 extends to a vicinity of the opening A. The pushers 34 are an example of the contact members in this invention. The rods 35 are an example of the link members in this invention.

The substrate container 1 further includes guide members 36. The guide members 36 support the rods 35 to be movable in the fore-and-aft direction. In other words, the guide members 36 directly prevent the rods 35 from deviating from the fore-and-aft direction. Consequently, the guide members 36 indirectly limit the moving direction of pushers 34 to the fore-and-aft direction. The fore-and-aft direction is an example of the one direction in this invention.

The substrate container 1 further includes a restricting member 37. The restricting member 37 specifies a movable range of the moving mechanism 31 to fix a range in which the moving mechanism 31 moves the wafers W. Consequently, a range in which the wafers W are moved by the moving mechanism 31 becomes constant. In this embodiment, the restricting member 37 has a flange 37a and a stopper 37b. The flange 37a is attached to one of the rods 35. The stopper 37b is fixed to the housing 2. When the rods 35 have moved to a predetermined position shown in FIG. 2B, the flange 37a contacts the stopper 37b, whereby the restricting member 37 prohibits the rods 35 from moving further forward from the predetermined position. The predetermined position therefore is a foremost position allowed for movement of the rods 35. Further, the position of the pushers 34 when the rods 35 are in the predetermined position is a foremost position in the forward direction allowed for movement of the pushers 34. Thus, the restricting member 37 specifies a forefront position of the rods 35 and a forefront position of the pushers 34.

Figure 3A:
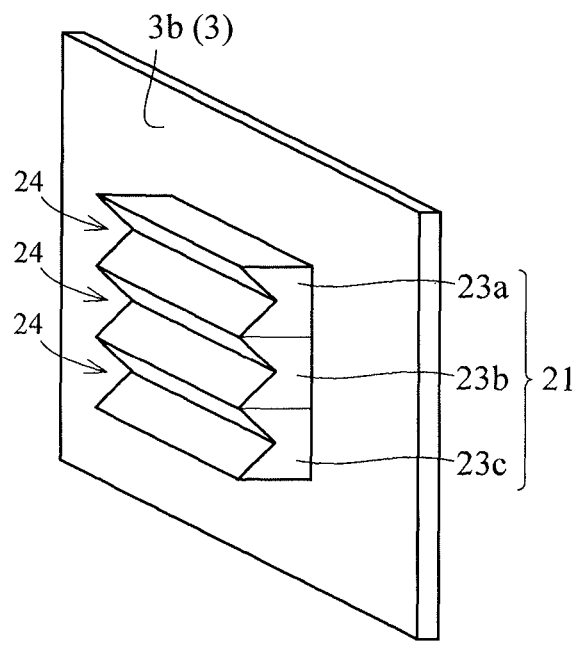
FIG. 3A is a perspective view showing the lid and lid-side support members.
Figure 3B:
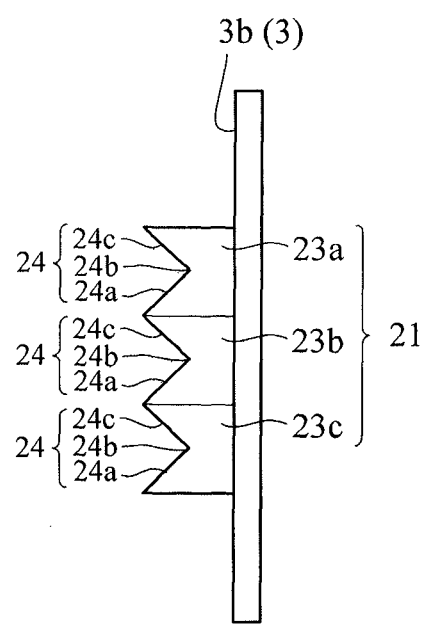
FIG. 3B is a side view showing the lid and lid-side support members.

Referring to FIGS. 3A and 3B, the surface of the lid 3 facing the interior of the housing 2 (i.e. the space S) in a state of the lid 3 being attached to the housing 2 is called "rear surface 3b". A lid-side support block 21 is fixed to the rear surface 3b. The lid-side support block 21 has lid-side support members 23a, 23b and 23c formed thereon. The lid-side support members 23a 23b and 23c are arranged in the vertical direction to be one above the other. When the lid 3 is attached to the housing 2, the lid-side support members 23a, 23b and 23c are opposed to the housing-side support members 16a, 16b and 16c at substantially the same heights, respectively. Each of the lid-side support members 23a, 23b and 23c supports an end of a wafer W. More particularly, each lid-side support member 23a, 23b or 23c supports an end of the front portion of a wafer W. In this way, preferably, the end of the wafer W supported by each lid-side support member 23a, 23b or 23c is opposed across the center of the wafer W to the end of the wafer W supported by each housing-side support member 16. In the following description, the lid-side support members 23a, 23b and 23c, when not particularly distinguished, will simply be called the "lid-side support member(s) 23".

The material of the lid-side support members 23 is a resin, for example. Preferably, the material of the lid-side support members 23 is a resin having elasticity. The lid-side support members 23 have a similar shape to the housing-side support members 16. That is, each lid-side support member 23 has a groove 24 formed therein. The groove 24 has a lower slope 24a, a deepest portion 24b and an upper slope 24c.

2. Constructions of Load Port Devices and Substrate Treating Apparatus

A substrate treating apparatus 41 to which the substrate container 1 is applied will be described with reference to FIGS. 4A and 4B. The substrate treating apparatus 41 includes a load port section 42 and a treating section 43. The load port section 42 has a plurality of load port devices 420, 421 and 422. Each load port device 420, 421 or 422 has a support table 44 and a lid opening and closing mechanism 45. The support table 44 receives the substrate container 1. The lid opening and closing mechanism 45 opens and closes the substrate container 1 placed on the support table 44. The lid opening and closing mechanism 45 has a shutter member 45a and a shutter drive mechanism 45b. The shutter member 45a detaches and attaches the lid 3 of the substrate container 1 on the support table 44, and holds the lid 3 detached from the substrate container 1. When the lid opening and closing mechanism 45 detaches the lid 3, the shutter drive mechanism 45b moves the shutter member 45a to positions P1, P2 and P3 successively (see FIG. 4B). When the shutter member 45a moves between position P1 and position P2, the shutter member 45a can move the lid 3 in the fore-and-aft direction while keeping the lid 3 in a state facing the opening A. The load port devices 420, 421 and 422 are an example of the load port apparatus in this invention.

The treating section 43 has a transport mechanism 47 and treating units 48. The transport mechanism 47 transports wafers W. The transport mechanism 47 accesses the substrate container 1 placed on the support table 44. Further, the transport mechanism 47 accesses the treating units 48. The transport mechanism 47 has a holding arm 47a for holding wafers W, and a holding arm drive mechanism 47b for moving the holding arm 47a. The treating units 48 treat the wafers W.

3. Examples of Operation

Next, examples of operation of the substrate container 1 according to Embodiment 1 will be described. In the following description, a state where the lid 3 is detached from the housing 2 will be described first. Then, an example of operation when attaching the lid 3 to the housing 2 and an example of operation when detaching the lid 3 from the housing 2 will be described. Finally, an example of operation for unloading the wafers W from the substrate container 1 will be described briefly.

3.1. State Where Lid 3 is Detached from Housing 2

Figure 4A:
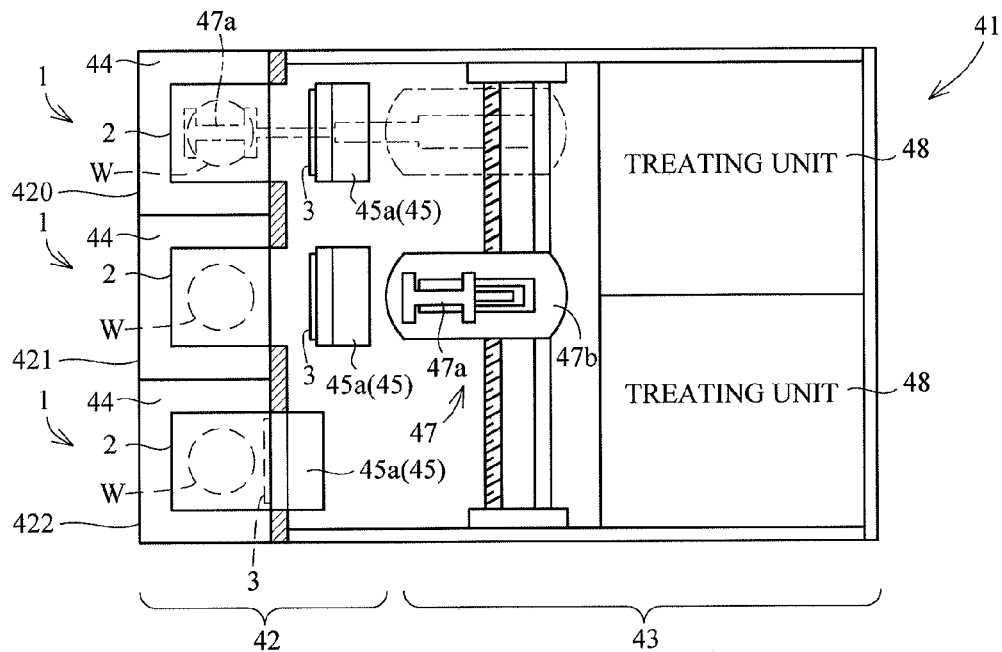
FIG. 4A is a plan view of a substrate treating apparatus.
Figure 4B:
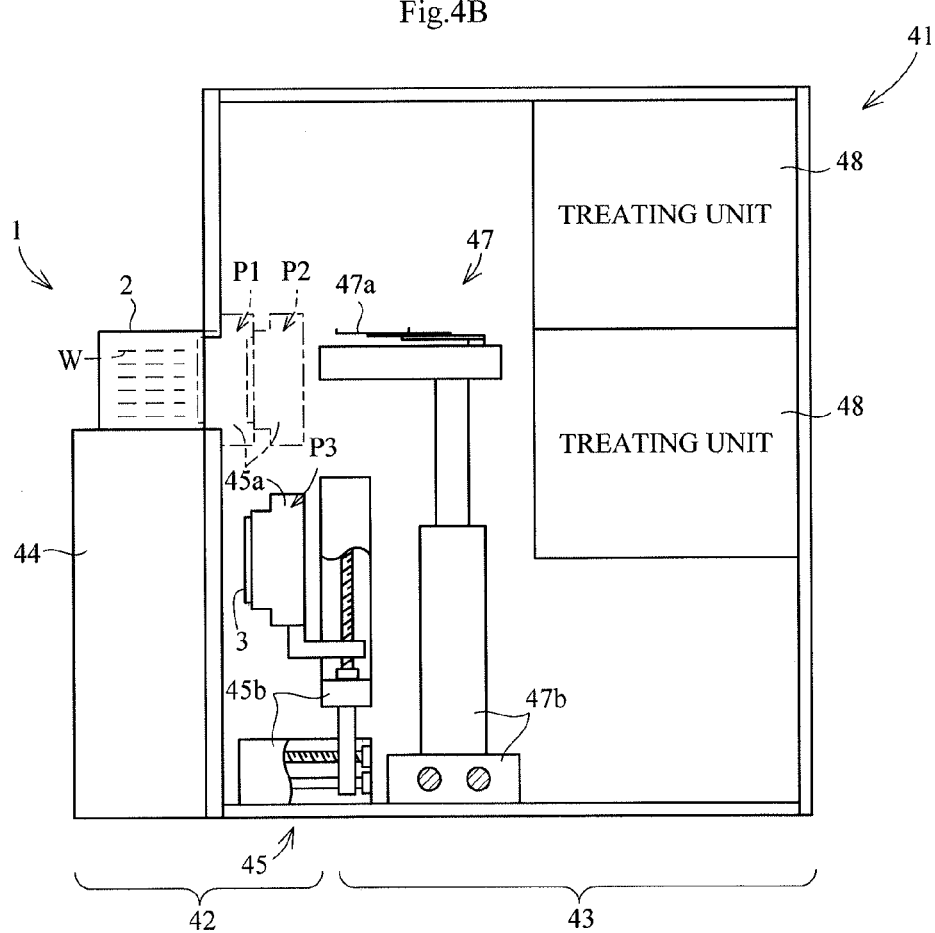
FIG. 4B is a side view of the substrate treating apparatus.

Referring to FIGS. 4A and 4B, the substrate container 1 is present on the support table 44. The lid 3 has been detached from the housing 2, and the substrate container 1 is open. The shutter member 45a is holding the lid 3 in the position P2 or position P3, for example.

Figure 5A:
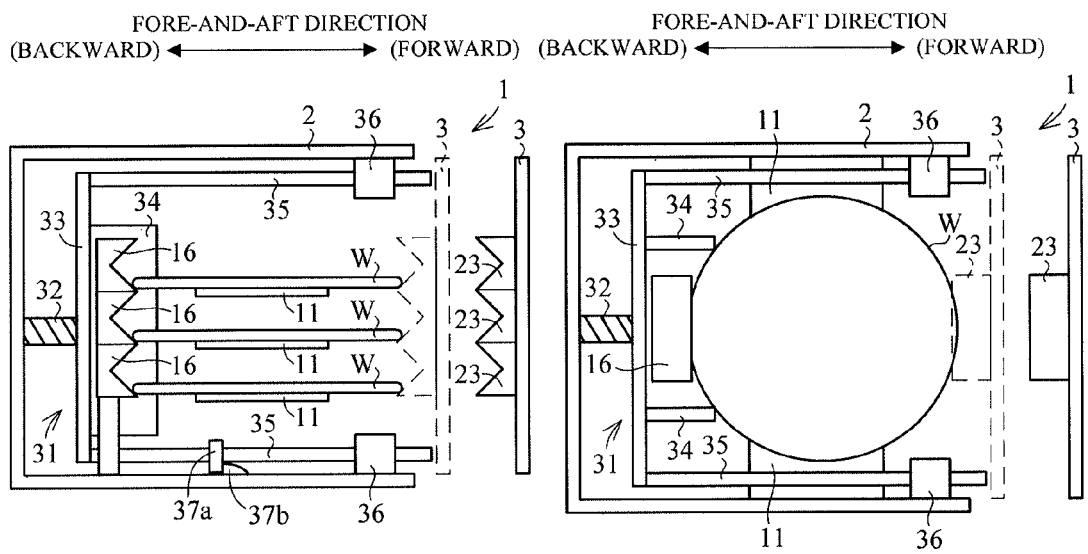
FIGS. 5A, 5B and 5C are views showing the interior of the substrate container when attaching and detaching the lid to/from the housing.

A more detailed description will be made with reference to FIG. 5A. The view on the left side in FIG. 5A is a side view, and the view on the right side in FIG. 5A is a plan view. The lid 3 is in a position shown in solid lines, for example. A wafer W is placed in a substantially horizontal position on each rack member 11. The lower surface of each wafer W is in contact with the rack member 11. An end of each wafer W is in contact with the housing-side support member 16 (more particularly, the lower slope 17a). In other words, the lower slope 17a receives the end of the rear portion of each wafer W. The lid-side support member 23 is separated from each wafer W.

The rods 35 are in the forefront position, the pushers 34 are also in the forefront front position, and the flange 37a is in contact with the stopper 37b. The spring 32 is in compressive deformation, whereby the spring 32 is pressing the movable plate 33 forward, and also pressing forward the rods 35 connected to the movable plate 33. The restricting member 37 is restricting further forward movement of the rods 35 and pushers 34. In the state where the lid 3 is detached from the housing 2, the pushers 34 may contact but do not need to contact the wafers W. Even if the pushers 34 are in contact with the wafers W, since the restoring force of the spring 32 is received by the stopper 37b, the restoring force of the spring 32 is not transmitted to the wafers W through the pushers 34. That is, the pushers 34 will never press the wafers W forward.

3.2. Example of Operation When Lid 3 is Attached to Housing 2

Referring to FIG. 4B, the shutter member 45a holding the lid 3 moves from position P2 to position P1. Consequently, the lid 3 is attached to the housing 2. This operation will be described in greater detail with reference to FIGS. 5A through 5C.

Referring to FIG. 5A, the lid 3, while facing the opening A, moves backward from the position shown in solid lines. When the lid 3 arrives at a position shown in dotted lines, the lid-side support members 23 (lower slopes 24a) contact the ends of the front portions of the wafers W. At this time, the lower surfaces of the wafers W are still in contact with the rack members 11.

Figure 5B:
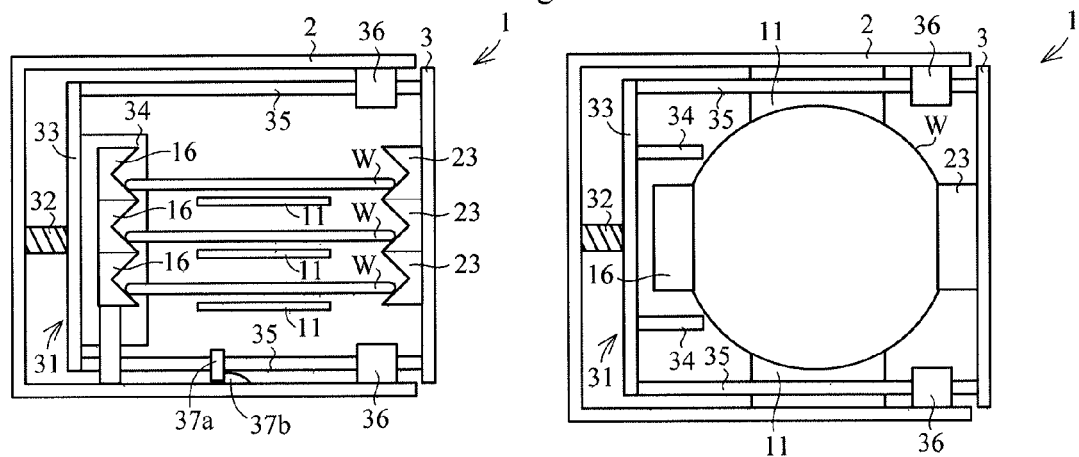

Referring to FIG. 5B, when the lid 3 moves further backward, the ends of the rear portions of the wafers W will move up along the lower slopes 17a, and the ends of the front portions of the wafers W will move up along the lower slopes 24a. As a result, the wafers W move upward and backward. With the upward movement of the wafers W, the lower surfaces of the wafers W separate from the rack members 11. If an amount of upward movement of the ends of the rear portions of the wafers W and an amount of upward movements of the ends of the front portions of the wafers W are in balance, the wafers W will make a parallel translation while maintaining the substantially horizontal position.

On the other hand, when the lid 3 moves backward, as shown in FIG. 5B, the lid 3 will contact the front ends of the rods 35 and press the rods 35 backward. The rods 35, movable plate 33 and pushers 34 move backward together. The flange 37a separates from the stopper 37b, and the spring 32 undergoes further compression and deformation.

Here, an amount of backward movement (moving speed) of the wafers W is less than an amount of backward movement (moving speed) of the lid 3. This is because the wafers W move not only backward but also upward along the lower slopes 17a and lower slopes 24a. On the other hand, an amount of backward movement (moving speed) of the pushers 34 is substantially the same as the amount of backward movement (moving speed) of the lid 3. The amount of backward movement (moving speed) of the pushers 34, therefore, is greater than the amount of backward movement (moving speed) of the wafers W. This allows a state of noncontact between the pushers 34 and the wafers W to be maintained during the operation of attaching the lid 3 to the housing 2 (the pushers 34 and the wafers W are separated in the plan view of FIG. 5B). With the pushers 34 contacting the wafers W in the state where the lid 3 is detached from the housing 2, when the operation for attaching the lid 3 starts, the pushers 34 will separate from the wafers W promptly (i.e. at an early stage of the attaching operation). Thus, contact between the pushers 34 and the wafers W can be prevented in the operation for attaching the lid 3 to the housing 2. Should the pushers 34 and the wafers W contact each other, if at all, the contacting time could be reduced. This can inhibit generation of particles due to the contact between the pushers 34 and the wafers W.

Figure 5C:
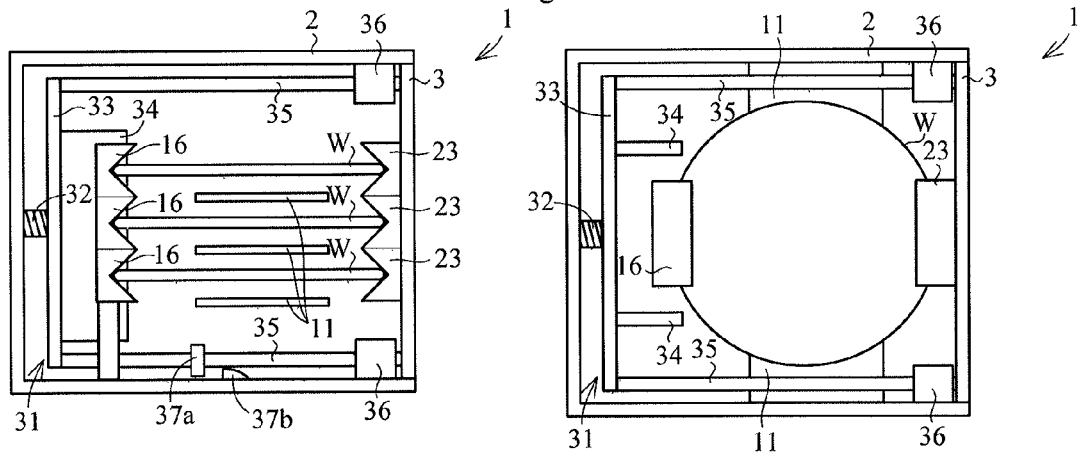

Referring to FIG. 5C, the lid 3 has arrived at the opening A and is attached to the housing 2. In the state of the lid 3 having been attached to the housing 2, the ends of the wafers W have moved up to the deepest portions 17b and 24b, the spring 32 has been further compressed and deformed, and the pushers 34 have moved further backward. The pushers 34 remain separate from the wafers W. The wafers W also remain separate from the rack members 11.

In the state where the lid 3 is attached to the housing 2, the housing-side support members 16 and lid-side support members 23 support the ends of the wafers W as held between the deepest portions 17b and 24b (hereinafter referred to as "clamp" where appropriate).

More particularly, the deepest portions 17b support the wafers W not to be movable upward. That is, when the wafers W are supported in the deepest portions 17b, the ends of the rear portions of the wafers W are immovable upward. In this specification, supporting to be immovable upward is referred to as "binding" where appropriate. The deepest portions 17b bind the wafers W. The deepest portions 17b are an example of the binding portions in this invention. The upper slopes 17c continuous upward from the deepest portions 17b further prevent the wafers W from moving upward.

3.3. Examples of Operation when Lid 3 is Detached from (Comes Off) Housing 2

Referring to FIG. 4B, the shutter member 45a moves to position P1 and holds the lid 3 attached to the housing 2. The shutter member 45a moves, together with the lid 3, from position P1 to position P2. Consequently, the lid 3 is detached from the housing 2. This operation will be described specifically hereinafter.

Referring to FIGS. 5C and 5B, the lid 3 moves forward from the opening A. Consequently, the lid 3 separates from the housing 2. The lid-side support members 23 move forward together with the lid 3. The ends of the front portions of the wafers W disengage from the deepest portions 24b and move down the lower slopes 24a.

When the lid 3 comes off, the rear portions of the wafers W may, or may not, automatically move down to the rack members 11. In other words, when the lid 3 comes off, the wafers W may automatically be placed on the rack members 11, or this may not be the case.

In the former case, when the lid 3 comes off, the ends of the rear portions of the wafers W will disengage from the deepest portions 17b and slide down the lower slopes 17a without being pushed by the pushers 34. As a result, the wafers W move down while moving forward (see FIG. 5B). If an amount of downward movement of the ends of the rear portions of the wafers W and an amount of downward movement of the ends of the front portions of the wafers W are in balance, the wafers W will make a parallel translation while maintaining the substantially horizontal position. And the wafers W will be placed in a substantially horizontal position on the rack members 11 (see FIG. 5A).

In the latter case, the ends of the rear portions of the wafers W cannot move down to the rack members 11 if not pushed by the pushers 34. Conceivable examples of the latter include a case where, although the lid 3 has come off, the ends of the rear portions of the wafers W do not under their own weight disengage from the deepest portions 17b, and a case where, although the ends of the rear portions of the wafers W have under their own weight disengaged from the deepest portions 17b, the ends of the rear portions of the wafers W stop halfway along the lower slopes 17a and do not slide down to the rack members 11. In these cases, the wafers W fail to be placed on the rack members 11 in a substantially horizontal position if not pushed by the pushers 34.

Figure 6:
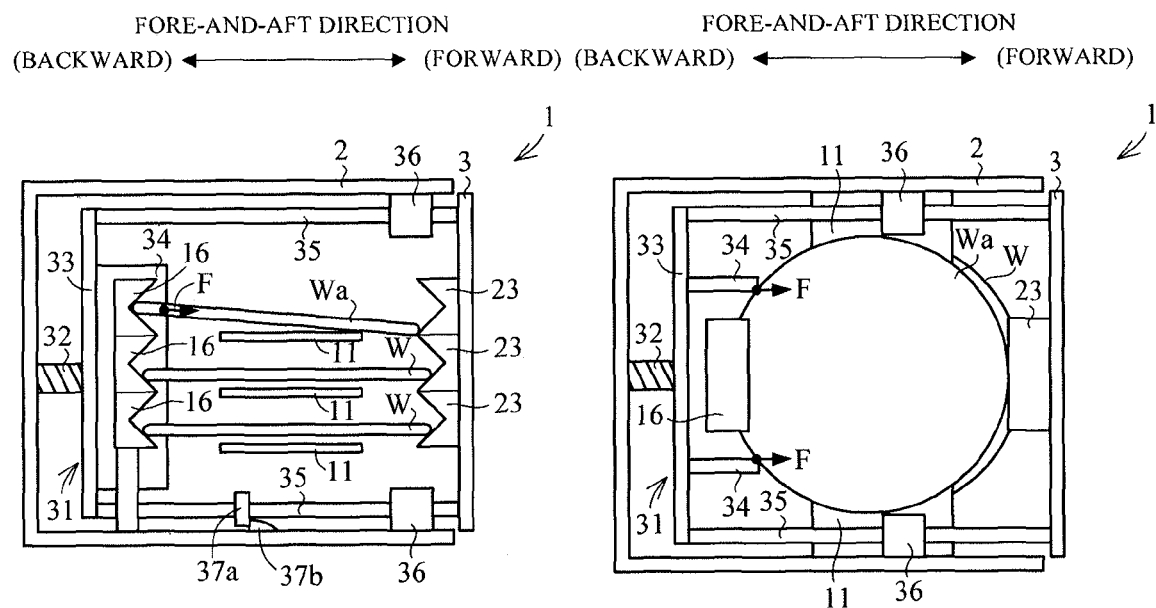
FIG. 6 is a view showing the interior of the substrate container when the lid separates from the housing.

Reference is made to FIG. 6. FIG. 6 shows, by way of example, a case where the end of a wafer Wa does not disengage from the deepest portion 17b when the lid 3 comes off. As shown, when the lid 3 has come off, although the end of the front portion of the wafer Wa has disengaged from the deepest portion 24a of the lid-side support member 23, the end of the rear portion of the wafer Wa has not disengaged from the deepest portion 17b of the housing-side support member 16 but remains supported by the deepest portion 17b. As a result, the wafer Wa assumes a tilted position. Specifically, the rear portion of the wafer Wa becomes higher than the front portion of the wafer Wa.

In the example shown in FIG. 6, after the lid 3 has separated from the housing 2, the deepest portion 17b still binds the wafer Wa, and the end of the rear portion of the wafer Wa remains incapable of moving downward and upward.

On the other hand, when the lid 3 separates from the housing 2, the rods 35 move forward by an amount corresponding to the movement of the lid 3. This is because the rods 35 are pressed forward by the spring 32. The pushers 34 move forward together with the rods 35.

And the pushers 34 push forward the wafer Wa which does not automatically move down to the rack member 11. FIG. 6 schematically shows force F with which the pushers 34 push the wafer Wa. With the pushers 34 pushing the wafer Wa forward, the pushers 34 forcibly move the rear portion of the wafer Wa to the rack member 11, and forcibly place the wafer Wa on the rack member 11. If, for example, there is a wafer W which does not automatically disengage from the deepest portion 17b, the pushers 34 will forcibly disengage the wafer W from the deepest portion 17b. Here, the term "disengage the wafer W from the deepest portion 17b" means move the wafer W away from the deepest portion 17b. If, for example, there is a wafer W which has stopped halfway on the lower slope 17a, the pushers 34 forcibly slide the wafer W down the lower slope 17a. Thus, the moving mechanism 31 can forcibly place the wafer W, which does not automatically move down to the rack member 11 when the lid 3 comes off, in a substantially horizontal position on the rack member 11. As a result, whether the wafers W automatically move down to the rack members 11 or not, all the wafers W in the housing 2 are placed appropriately on the rack members 11.

When the flange 37a and stopper 37b contact each other, the pushers 34 will stop in the forefront position. This completes the operation for the pushers 34 to push the wafer W which does not automatically move down to the rack member 11. In the operation in which the lid 3 separates from the housing 2, the pushers 34 hardly contact the wafers W which automatically move down to the rack members 11. Strictly speaking, in the operation in which the lid 3 separates from the housing 2, the pushers 34 do not at all contact the wafers W which automatically move down to the rack members 11, or even if the pushers 34 contact such wafers W, the distance the pushers 34 push the wafers W which automatically move down to the rack members 11 is shorter than the range of movement of the pushers 34. This is because it is when the pushers 34 have advanced to the vicinity of the forefront position that the pushers 34 begin to contact the wafers W which automatically move down to the rack members 11. In the scene shown in FIG. 6, for example, the pushers 34 are not yet in contact with the two wafers W that have moved down to the rack members 11. In the scene shown in FIG. 5B, for example, the pushers 34 are not yet in contact with any one of the three wafers W that have moved down to the rack members 11 (see the plan view of FIG. 5B in particular). In the mode in which the pushers 34 do not at all contact the wafers W that automatically move down to the rack members 11, the generation of particles can be inhibited with increased effect. On the other hand, the mode in which the pushers 34 contact the wafers W that automatically move down to the rack members 11, positions in the fore-and-aft direction of the wafers W can be uniformed easily while keeping under control the distance the pushers 34 push the wafers W. That is, in the latter mode, the pushers 34 function also as aligning members for aligning the wafers W. Further, the restricting member 37 controls the forefront positions of the pushers 34 to be uniform. Therefore, when the lid 3 separates from the housing 2, the pushers 34 can always align the wafers W to the same position.

When the lid 3 and lid-side support members 23 move further forward, the lid 3 will separate from the rods 35, and the lid-side support members 23 (lower slopes 24a) separate from the wafers W. This completes separation of the lid 3. After separation of the lid 3 is completed, the housing-side support members 16 (lower slopes 17a) may remain in contact with the wafers W.

3.4. Example of Operation for Unloading Wafers W from Substrate Container 1

Referring to FIGS. 4A and 4B, the housing 2 is open. All the wafers W in the housing 2 are placed in the substantially horizontal position on the rack members 11. The lid 3 and shutter member 45a are located in position P3. The holding arm 47a advances into the housing 2. Specifically, the holding arm 47a advances to a position under the rack member 11 on which the wafer W to be unloaded is placed. And the holding arm 47a moves up slightly, and picks up and holds the one wafer W from the rack member 11. Then, the holding arm 47a holding the wafer W exits the housing 2. In this way, the transport mechanism 47 unloads the wafer W from the substrate container 1. And the holding arm 47a transports the wafer W to a treating unit 48.

4. Effects of Embodiment 1

In the operation for detaching the lid 3, the moving mechanism 31 moves a wafer W which does not automatically move into a state for being placed on the rack member 11. When, for example, there is a wafer W remaining to be held by the deepest portion 17b as the lid 3 separates from the housing 2, the moving mechanism 31 will push the wafer W forward and disengage it from the deepest portion 17b. Consequently, the binding of the wafer W by the deepest portion 17b is canceled, and each wafer W becomes movable upward. And the moving mechanism 31 places the wafers W in a substantially horizontal position on the rack members 11. Consequently, clearances in the vertical direction between the wafers W can be secured appropriately. The holding arm 47a can therefore advance conveniently into the clearances between the wafers W, and can hold the wafers W conveniently. That is, the transport mechanism 47 can unload the wafers W appropriately from the substrate container 1. Thus, the substrate container 1 can allow the wafers W to be unloaded therefrom conveniently.

In the operation for attaching the lid 3 to the housing 2, the moving mechanism 31 does not obstruct backward movement of the wafers W. Specifically, since the pushers 34 also move backward when the lid 3 is attached to the housing 2, the pushers 34 do not obstruct backward movement of the wafers W. The spring 32, movable plate 33 and rods 35 are arranged in positions with no possibility of contacting the wafers W. The wafers W can therefore move smoothly backward. As a result, the housing-side support members 16 can support the wafers W conveniently in the deepest portions 17b.

By using the operation of the lid 3 being attached to the housing 2, the pushers 34 are driven backward and the spring 32 stores restoring force. And in the operation for detaching the lid 3 from the housing 2, the spring 32 exerts the restoring force. This restoring force is used to drive the pushers 34 forward and move the wafers W. With the moving mechanism 31 constructed in this way, the moving mechanism 31 does not require separately a power source or power mechanism for moving the wafers W, such as an actuator or drive mechanism, for example. That is, the construction of the moving mechanism 31 can be simplified and reduced in size.

The moving mechanism 31 includes rods 35. The rods 35 conveniently interlock movement of the lid 3 relative to the housing 2 and elastic deformation of the spring 32. In this embodiment, the rods 35 are interlocked with the movement of the lid 3 at a time of attachment to cause compressive deformation of the spring 32, and are interlocked with the movement of the lid 3 at a time of detachment to restore the spring 32. Thus, the rods 35 extend and contract the spring 32 in response to the movements of the lid 3. The construction of the moving mechanism 31 can therefore be further simplified and reduced in size.

The rods 35 transmit force between the lid 3 and spring 32 without passing it through the wafers W. For example, the rods 35 transmit force from the lid 3 to the spring 32 without passing it through the wafers W to compress the spring 32. Consequently, there is no possibility of applying unnecessary force to the wafers W, and thus no possibility of damaging the wafers W.

The moving mechanism 31 includes pushers 34 separately from the spring 32. A material, shape and so on of the pushers 34 can therefore be selected or designed to suit the wafers W. The spring 32 does not contact the wafers W directly. Thus, the wafers W can be protected advantageously.

The pushers 34 do not contact the wafers W during the operation for attaching the lid 3 to the housing 2, and in the state where the lid 3 is attached to the housing 2. Consequently, occasions of contact between the pushers 34 and the wafers W can be reduced, thereby to avoid an unnecessary generation of particles. Further, when the lid 3 separates from the housing 2, the pushers 34 do not at all or hardly contact the wafers W which automatically move down to the rack members 11. Thus, the occasions of contact between the pushers 34 and the wafers W can be further reduced.

The guide members 36 restrict the moving direction of the pushers 34 to the fore-and-aft direction. The pushers 34 only move forward and backward linearly in the fore-and-aft direction. The pushers 34 can therefore move the wafers W in an appropriate direction during the operation for detaching the lid 3 from the housing 2.

As shown in FIG. 2C, the forward ends of the pushers 34 provide substrate contact surfaces which contact the wafers W. Since these forward ends have a height (dimension in the vertical direction) that is long enough, the pushers 34 can contact all the wafers W in the housing 2. Since the width (i.e. dimension in the transverse direction) of the forward ends is short compared with the height of the forward ends, the areas of the pushers 34 for contacting each wafer W can be reduced. As noted above, the moving direction of the pushers 34 is restricted to the fore-and-aft direction by the guide members 36. The forward ends of the pushers 34 do not therefore incline with movement of the pushers 34, but are maintained parallel to the vertical direction. Consequently, the pushers 34 can move a plurality of wafers W forward at the same time, while the positions in the fore-and-aft direction of the wafers W are maintained in an aligned state.

The restricting member 37 specifies a movable region of the pushers 34. This fixes a forefront position of the pushers 34, and fixes a range in which the moving mechanism 31 moves the wafers W. Consequently, the position in the fore-and-aft direction of the wafers W in the housing 2 upon completion of the operation for detaching the lid 3 from the housing 2 can be fixed. As a result, the transport mechanism 41 can unload the wafers W with increased aptness.

When the material of the lid-side support members 23 is an elastic resin, the lid-side support members 23 can hold the wafer W properly. When the material of the housing-side support members 16 is an elastic resin, the housing-side support members 16 can hold the wafers W properly.

The load port devices 420, 421 and 422 are well suited for placing the substrate containers 1.

The substrate treating apparatus 41 can perform treatments such as solution treatment, heat treatment and so on of the wafers W storable in the substrate containers 1.

Embodiment 2

Embodiment 2 of this invention will be described hereinafter with reference to the drawings. A substrate container 1 according to Embodiment 2 includes a moving mechanism and restricting members different in construction from those of Embodiment 1. In the following description, components identical to those of Embodiment 1 are shown with the same signs, and will not particularly be described.

1. Construction of Substrate Container

Figure 7:
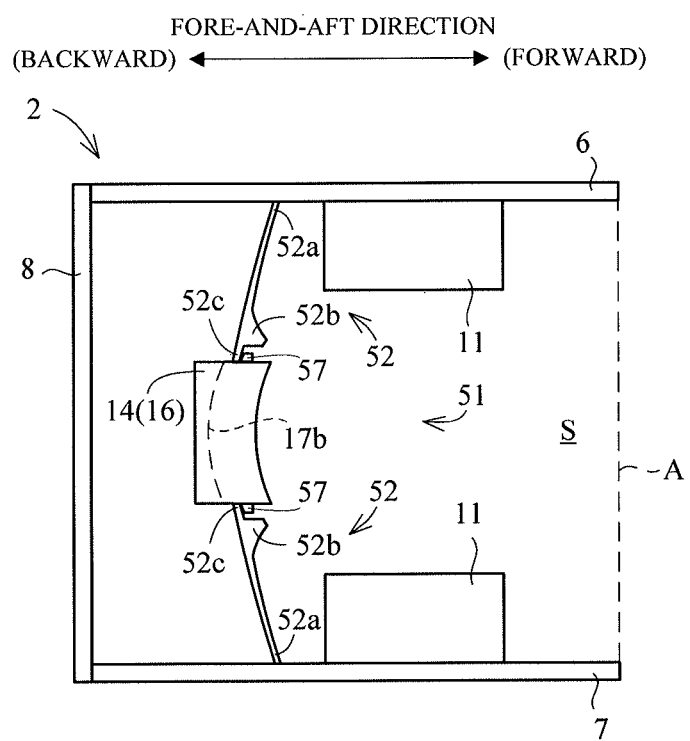
FIG. 7 is a plan view showing the interior of a housing according to Embodiment 2.

Referring to FIG. 7, the substrate container 1 includes a moving mechanism 51. The moving mechanism 51 has a plurality of springs 52. The springs 52 are cantilever springs, for example. Each spring 52 has a proximal end portion 52a, a contact portion 52b and a projecting portion 52c. The proximal end portion 52a is fixed to the housing 2. In this embodiment, the proximal end portion 52a of one of the springs 52 is fixed to the right wall 6, while the proximal end portion 52a of the other spring 52 is fixed to the left wall 7. Each spring 52 is displaceable (bendable/curvable) with the proximal end portion 52a acting as a fulcrum, to move the contact portion 52b and projecting portion 52c. Consequently, the position in the fore-and-aft direction of the contact portion 52b changes. The springs 52 are an example of the elastic member in this invention.

The pair of springs 52 fixed to the right wall 6 and left wall 7 contact the same wafers W. Specifically, the contact portion 52b of each spring 52 directly contacts the wafers W. One contact portion 52b may contact a plurality of wafers W all together, or may contact only one wafer W. In the latter case, a plurality of springs 52 are arranged in the vertical direction.

The substrate container 1 includes restricting members 57. The restricting members 57 can contact the projecting portions 52c. The restricting members 57 are fixed to the housing-side support block 14. In the scene shown in FIG. 7, the projecting portions 52c are in contact with the restricting members 57. Consequently, the restricting members 57 prohibit the contact portions 52b from moving further forward. The positions of the contact portions 52b when the projecting portions 52c contact the restricting members 57 are forefront positions of the contact portions 52b. Thus, the restricting members 57 specify a movable range of the moving mechanism 51.

2. Examples of Operation 2.1. State Where Lid 3 is Detached from Housing 2

Figure 8A:
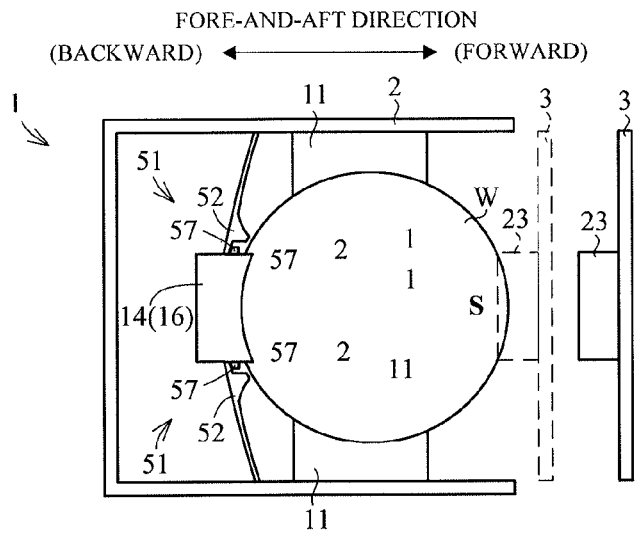
FIGS. 8A, 8B and 8C are plan views showing the interior of the substrate container when attaching and detaching the lid to/from the housing.

Referring to FIG. 8A, the lid 3 is in a position shown in solid lines, for example. The wafers W are placed on the rack members 11. The housing-side support members 16 are supporting the ends of the rear portions of the wafers W. The springs 52 are in contact with the restricting members 57. The moving mechanism 51 (springs 52) is not in contact with the wafers W. The lid-side support members 23 are not in contact with the wafers W.

2.2. Example of Operation when Lid 3 is Attached to Housing 2

Referring to FIG. 8A, the lid 3 moves backward from the position shown in solid lines, for example. When the lid 3 arrives at a position shown in dotted lines, the lid-side support members 23 contact the ends of the front portions of the wafers W.

Figure 8B:
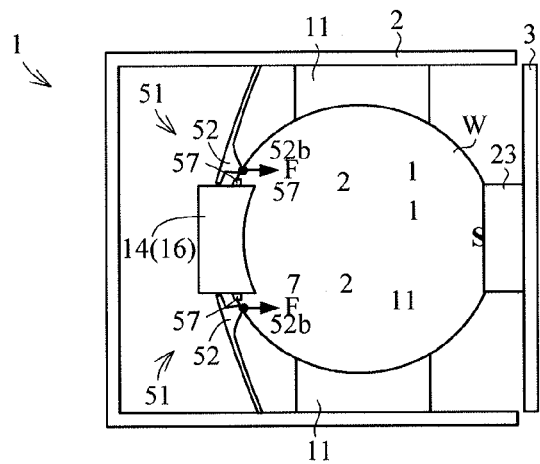

Referring to FIG. 8B, the lid 3 moves further backward. The lid-side support members 23 push the wafers W backward. The housing-side support members 16 and lid-side support members 23 raise the wafers W while moving the wafers W backward. With the upward movement, the wafers W separate from the rack members 11. With the backward movement, the wafers W contact the springs 52 (contact portions 52b). The wafers W move further backward while deforming the springs 52.

Figure 8C:
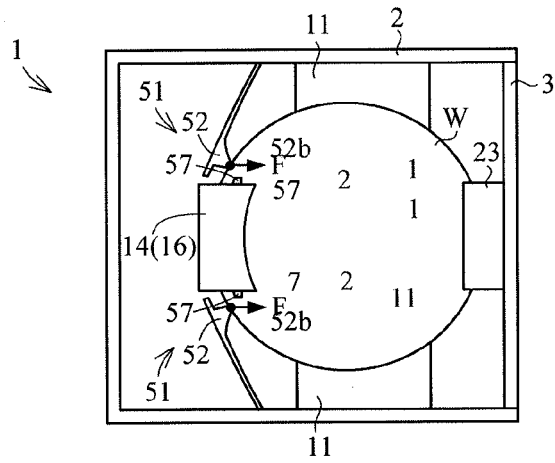

Referring to FIG. 8C, the lid 3 reaches the opening A and is attached to the housing 2. In the state where the lid 3 is attached to the housing 2, the housing-side support members 16 and lid-side support members 23 clamp the ends of the wafers W in between, and the wafers W are separate from the rack members 11. The housing-side support members 16 support the wafers W in the deepest portions 17b. At this time, the springs 52 are in a bent state and in contact with the wafers W.

2.3. Example of Operation when Lid 3 is Detached from Housing 2

When the lid 3 separates from the housing 2, a transition is made from the state shown in FIG. 8C via the state shown in FIG. 8B to the state shown in FIG. 8A. This will be described specifically hereinafter.

The lid 3 and lid-side support members 23 move forward together from the opening A. The springs 52 move the wafers W forward. FIGS. 8C and 8B schematically show force F with which the springs 52 push the wafers W. The springs 52 push and move forward all the wafers W supported in the deepest portions 17b. As a result, each wafer W disengages from the deepest portion 17b, and moves down the lower slope 17a (see FIG. 8B).

When the springs 52 contact the restricting members 57, the contact portions 52b will stand still in the forefront positions, which ends the operation of the springs 52 pushing the wafers W. When the lid 3 and lid-side support members 23 move further forward, the wafers W will move forward and downward, thereby separating from the springs 52. Eventually the wafers W are placed in a substantially horizontal position on the rack members 11 (see FIG. 8A). When the lid 3 and lid-side support members 23 move further forward, the lid-side support members 23 will separate from the wafers W.

3. Effects of Embodiment 2

In the operation for detaching the lid 3 from the housing 2, the moving mechanism 51 moves all the wafers W supported in the deepest portions 17b. Thus, the same functional effects are obtained as from Embodiment 1. That is, when the lid 3 separates from the housing 2, the moving mechanism 51 disengages the wafers W from the deepest portions 17b, and places the wafers W in a substantially horizontal position on the rack members 11. The transport mechanism 47 can therefore unload the wafers W appropriately from the substrate container 1.

The moving mechanism 51 includes springs 52. The contact portions 52b of the springs 52 are movable backward. In the operation for attaching the lid 3 to the housing 2, the springs 52 are deformed in response to the backward movement of the wafers W. The wafers W can therefore move backward appropriately. As a result, the housing-side support members 16 can advantageously support the wafers W in the deepest portions 17b.

The backward movement of the lid 3 causes backward movement of the wafers W, and the backward movement of the wafers W causes deformation of the springs 52. The forward movement of the lid 3 causes forward movement of the wafers W and restoration of the springs 52. Thus, the wafers W interposed between the lid 3 and the springs 52 interlock the fore and aft movements of the lid 3 and the deformation/restoration of the springs 52. The moving mechanism 51 does not therefore need to include a mechanism for transmitting the motion of the lid 3 to the springs 52. For example, the movable plate 33, rods 35 and so on shown in Embodiment 1 can be omitted. Consequently, the construction of the moving mechanism 51 can be simplified and reduced in size. In the absence of members such as the rods 35 that contact the lid 3 or move within the housing 2, the generation of particles and the like can be further inhibited.

In a construction in which each spring 52 contacts only one wafer W, each wafer W can be moved appropriately.

Embodiment 3

Embodiment 3 of this invention will be described hereinafter with reference to the drawings. A substrate container 1 according to Embodiment 3 includes a moving mechanism different in construction from that of Embodiment 1. In the following description, components identical to those of Embodiment 1 are shown with the same signs, and will not particularly be described.

1. Construction of Substrate Container

Figure 9:
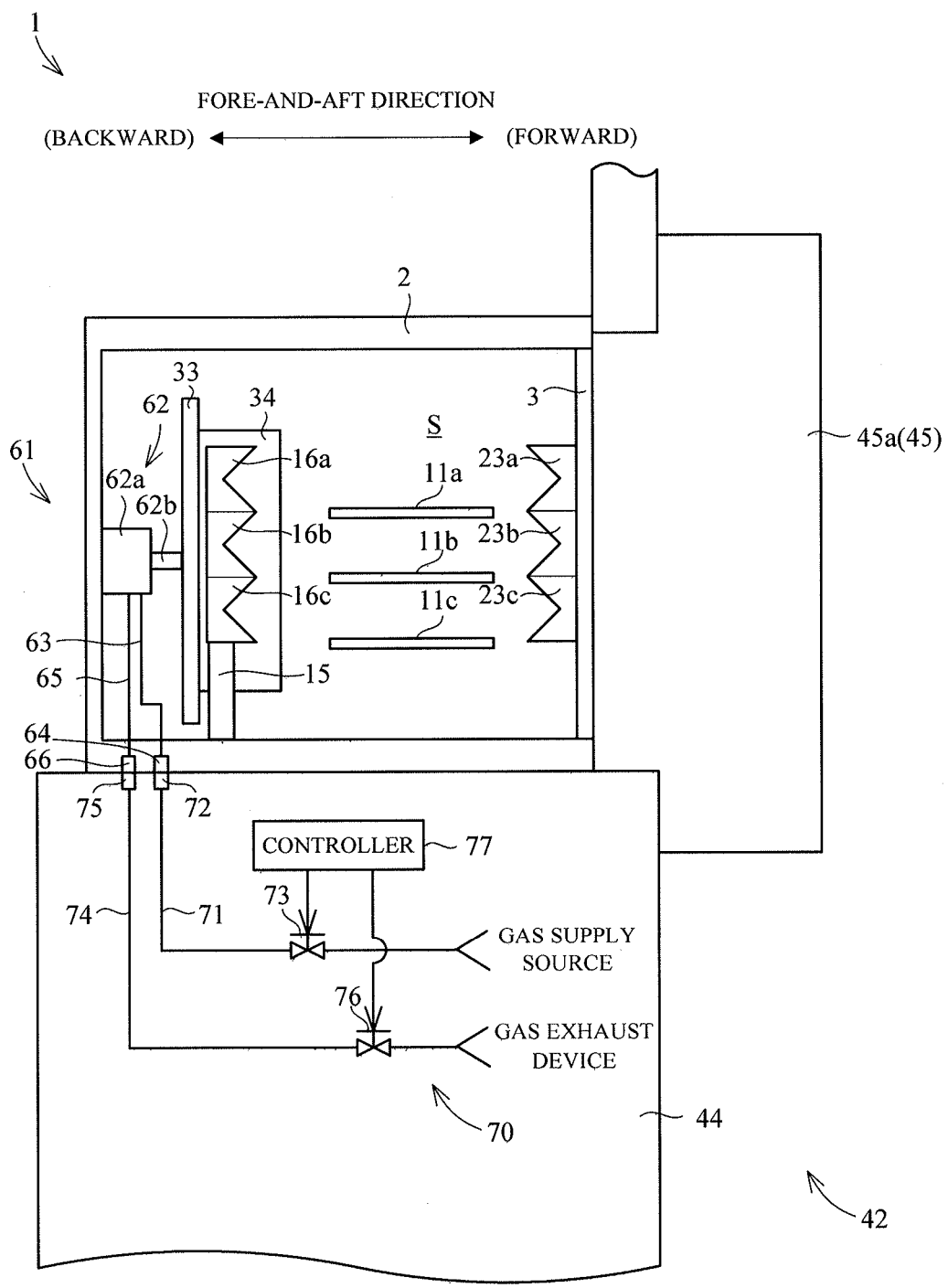
FIG. 9 is an enlarged side view showing a substrate container and a load port apparatus according to Embodiment 3.

Referring to FIG. 9, a moving mechanism 61 includes a movable plate 33, pushers ers 34 and an air cylinder 62. The air cylinder 62 is extendible and contractible by gas supply and exhaust. The air cylinder 62 has a cylinder portion 62a and a piston rod 62b. The cylinder portion 62a is fixed to the housing 2. The piston rod 62b is movable in the fore-and-aft direction relative to the cylinder portion 62a. A forward end of the piston rod 62b is fixed to the movable plate 33. The air cylinder 62 is an example of the gas-operated device in this invention.

The moving mechanism 61 further includes a gas supply pipe 63, a gas supply port 64, a gas exhaust pipe 65 and a gas exhaust port 66. The gas supply pipe 63 is a path for supplying a gas (e.g. an inert gas) to the cylinder portion 62a. One end of the gas supply pipe 63 is connected to the cylinder portion 62a. The other end of the gas supply pipe 63 is connected to the gas supply port 64. The gas exhaust pipe 65 is a path for exhausting the gas from the cylinder portion 62a. One end of the gas exhaust pipe 65 is connected to the cylinder portion 62a. The other end of the gas exhaust pipe 65 is connected to the gas exhaust port 66. The gas supply port 64 and gas exhaust port 66 are connectable to an external device 70 provided outside the substrate container 1. The gas supply pipe 63 and gas exhaust pipe 65 are an example of the gas flow paths in this invention. The gas supply port 64 and gas exhaust port 66 are an example of the connection ports in this invention.

The external device 70 is provided in the load port section 42, for example. The external device 70 controls the gas supply and exhaust to/from the air cylinder 62. The external device 70 includes a gas supply pipe 71, a gas supply port 72, a supply valve 73, a gas exhaust pipe 74, a gas exhaust port 75, an exhaust valve 76 and a controller 77. One end of the gas supply pipe 71 is connected to a gas supply source. The gas supply source may be provided outside the load port section 42, or may be provided in the load port section 42. The gas supply source may be an air compressor and an air filter, or may be cylinders of an inert gas, for example. The other end of the gas supply pipe 71 is connected to the gas supply port 72. The gas supply port 72 is connectable to the gas supply port 64. The supply valve 73 is mounted on an intermediate part of the gas supply pipe 71. One end of the gas exhaust pipe 74 is connected to a gas exhaust device. The gas exhaust device may be provided outside the load port section 42, or may be provided in the load port section 42. The gas exhaust device is a vacuum pump, an exhaust blower, or an ejector, for example. The other end of the gas exhaust pipe 74 is connected to the gas exhaust port 75. The gas exhaust port 75 is connectable to the gas exhaust port 66. The exhaust valve 76 is mounted on an intermediate part of the gas exhaust pipe 74. The controller 77 operates the supply valve 73 and exhaust valve 76 to control the gas supply and exhaust to/from the air cylinder 62.

When the gas supply ports 64 and 72 are connected to each other, each of the gas supply ports 64 and 72 will open. Consequently, the gas supply pipe 63 and gas supply pipe 71 communicate with each other. When the gas supply ports 64 and 72 separate from each other, each of the gas supply ports 64 and 72 will close. Consequently, each of the other ends of the gas supply pipes 63 and 71 is closed. The same applies to the gas exhaust ports 66 and 75.

2. Examples of Operation 2.1. Example of Operation when Placing Substrate Container 1 on Support Table 44

When the substrate container 1 is placed on the support table 44, the gas supply ports 64 and 72 will connect to each other and the gas exhaust ports 66 and 75 will connect to each other. Consequently, the gas supply pipes 63 and 71 communicate with each other and the gas exhaust pipes 65 and 74 communicate with each other.

2.2. Example of Operation when Lid 3 is Attached to Housing 2

The controller 77 operates the supply valve 73 and exhaust valve 76 to contract the air cylinder 62. The pushers 34 withdraw backward.

After the pushers 34 withdraw backward, the lid 3 moves backward toward the opening A. The housing-side support members 16 and lid-side support members 23, as in Embodiment 1, move the wafers W up along the lower slopes 17a and lower slopes 24a, and raise the wafers W above the rack members 11.

The lid 3 moves to the opening A, and is attached to the housing 2. In the state where the lid 3 is attached to the housing 2, the housing-side support members 16 and lid-side support members 23, as in Embodiment 1, support the wafers W as clamped between the deepest portions 17b and 24b. Since the pushers 34 have withdrawn backward beforehand, the pushers 34 do not contact the wafers W in the state where the lid 3 is attached to the housing 2.

2.3. Examples of Operation when Lid 3 is Detached from Housing 2

The lid 3 moves forward from the opening A. The front portions of the wafers W move down to the rack members 11. The rear portions of the wafers W may, or may not, automatically move down to the rack members 11. In the former case, the wafers W are placed in a substantially horizontal position on the rack members 11. Examples of the latter include a case where the wafers W remain supported by the deepest portions 17b, and a case where the wafers W stop halfway along the lower slopes 17a. Anyway, in the latter case, the wafers W are not automatically placed in a substantially horizontal position on the rack members 11. In the latter case, the wafers W assume a tilted position, for example.

After the lid 3 separates from the housing 2, the controller 77 operates the supply valve 73 and exhaust valve 76 to extend the air cylinder 62. The pushers 34 move forward. The pushers 34 forcibly move any wafers W that did not automatically move down to the rack members 11 even if the lid 3 came off, and place such wafers W in a substantially horizontal position on the rack members 11.

3. Effects of Embodiment 3

The moving mechanism 61 has the air cylinder 62. By controlling this air cylinder 62, the position, amount of movement, moving speed, moving time and so on of the pushers 34 can be managed flexibly. As in the examples of operation described above, for instance, the pushers 34 can be moved backward before the lid 3 is attached, and the pushers 34 can be moved forward after the lid 3 comes off.

The external device 70 can drive the air cylinder 62 by gas supply and exhaust, which enables the external device 70 to control the moving mechanism 61 easily. Specifically, the external device 70 can control the fore-and-aft movements of the pushers 34 easily.

The external device 70 is provided outside the substrate container 1. This can conveniently inhibit the construction of the substrate container 1 becoming complicated.

Embodiment 4

Embodiment 4 of this invention will be described hereinafter with reference to the drawings. A substrate container 1 according to Embodiment 4 is different from that of Embodiment 1 in that the lid-side support members 23 are vertically movable relative to the lid 3. In the following description, components identical to those of Embodiment 1 are shown with the same signs, and will not particularly be described.

1. Construction of Substrate Container

Reference is made to FIGS. 10A and 10B. FIGS. 10A and 10B respectively show a front view and a side view of the lid 3. The substrate container 1 includes a lock mechanism 81 and a lid-side lift mechanism 85.

The lock mechanism 81 locks the lid 3 to the housing 2. The lock mechanism 81 includes key grooves 82, gears 83 and lock members 84. The key grooves 82 are arranged on a surface of the lid 3. Each key groove 82 has a key inserted therein for operating the lock mechanism 81. Each gear 83 rotates in two, forward and reverse, directions in response to operation of the key. Each lock members 84 is interlocked to the gear 83. By rotation of the gear 83, each lock member 84 is movable between a projecting position and a retracted position. In the retracted position, the entire lock member 84 fits in the lid 3 (see FIG. 10A). In the projecting position, part of each lock member 84 projects out of the lid 3 (see FIG. 10B).

The lid opening and closing mechanism 45 (see FIGS. 4A and 4B) operates the lock mechanism 81. Specifically, the lid opening and closing mechanism 45 has the keys (not shown), and controls the lock mechanism 81 with the keys inserted in the key grooves 82. The housing 2 has recesses (not shown) for mating connection with the lock members 84 in the projecting positions. When the lock members 84 move to the projecting positions in the state where the lid 3 is attached to the housing 2, the lock members 84 combine with the recesses to lock the lid 3 to the housing 2. That is, the lid 3 becomes inseparable from the housing 2. When the lock members 84 move to the retracted positions in the state where the lid 3 is attached to the housing 2, the lock members 84 separate from the recesses to unlock the lid 3 from the housing 2. That is, the lid 3 becomes separable from the housing 2.

The lid-side lift mechanism 85 is interlocked with operation of the lock mechanism 81 to move the lid-side support members 23 up and down relative to the lid 3. The lid-side lift mechanism 85 includes gears 86 and a rack 87. The gears 86 are meshed with the gears 83. The rack 87 is interlocked with the gears 86. When the gears 83 rotate, the gears 86 will rotate and the rack 87 will move up and down relative to the lid 3. In this way, the lid-side lift mechanism 85 is interlocked with the lock mechanism 81.

The lid-side support block 21 is fixed to the rack 87. When the lock members 84 move to the projecting positions, the lid-side support members 23 will move up relative to the lid 3. When the lock members 84 move to the retracted positions, the lid-side support members 23 will move down relative to the lid 3. Here, the position of the lid-side support members 23 when the lock members 84 are in the retracted positions is called a "lower position". The position of the lid-side support members 23 when the lock members 84 are in the projecting positions is called an "upper position".

In the state where the lid 3 is attached to the housing 2, the lid-side support members 23, rack members 11 and housing-side support members 16 are in the following height relationships. When the lid-side support members 23 are in the lower position, the position of the deepest portion 24b of the lid-side support member 23a is at a height substantially equivalent to the plane of contact of the rack member 11a, and is lower than the deepest portion 17b of the housing-side support portion 16a. When the lid-side support members 23 are in the upper position, the position of the deepest portion 24b of the lid-side support member 23a is at a height substantially equivalent to the deepest portion 17b of the housing-side support portion 16a, and is higher than the plane of contact of the rack member 11a. The height relationship between the lid-side support member 23b, rack member 11b and housing-side support member 16b, and the height relationship between the lid-side support member 23c, rack member 11c and housing-side support member 16c, are the same as the height relationship between the lid-side support member 23a, rack member 11a and housing-side support member 16a.

2. Examples of Operation

2.1. State where Lid 3 is Detached from Housing 2

Figure 11A:
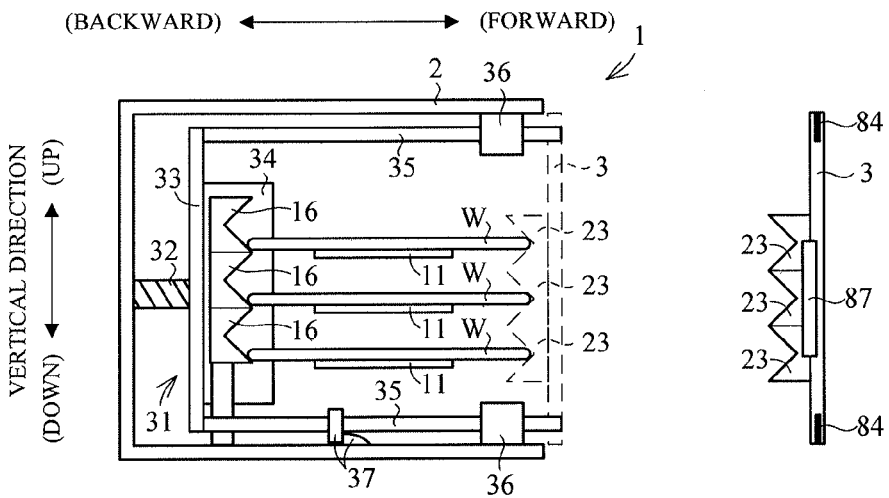
FIGS. 11A, 11B and 11C are side views showing an interior of a substrate container when attaching and detaching the lid to/from the housing.

Referring to FIG. 11A, the lid 3 is in a position shown in solid lines, for example. The lock members 84 are in the retracted positions. The lid-side support members 23 are in the lower position.

2.2. Example of Operation when Lid 3 is Attached to Housing 2

Referring to FIG. 11A, when the lid 3 moves to a position shown in dotted lines, the deepest portions 24b of the lid-side support members 23 contact the ends of the front portions of the wafers W.

Figure 11B:
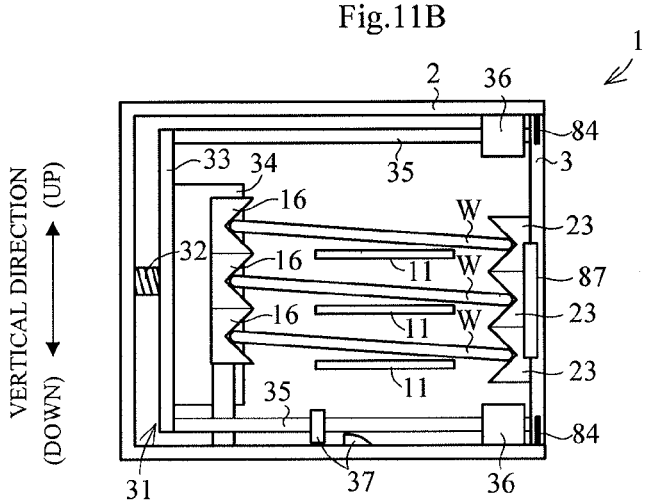

Referring to FIG. 11B, the lid 3 moves to the opening A and is attached to the housing 2. The lid-side support members 23 push the wafers W backward. Consequently, the ends of the rear portions of the wafers W move along the lower slopes 17a and reach the deepest portions 17b. During this operation, the ends of the front portions of the wafers W remain supported by the deepest portions 24b and the wafers W do not move relative to the lid-side support members 23. The housing-side support members 16 and lid-side support members 23 clamp the ends of the wafers W in between, with the lower surfaces of the wafers W not contacting the rack members 11. The wafers W are in a tilted position.

Figure 11C:
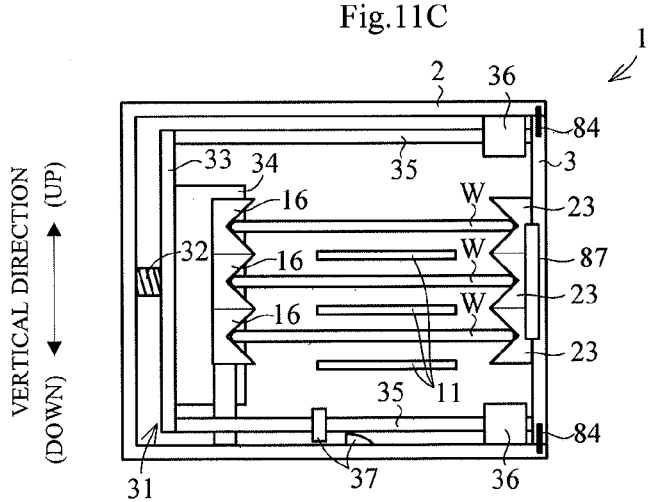

Referring to FIG. 11C, the lock mechanism 81 locks the lid 3 to the housing 2. Specifically, the lock members 84 move from the retracted positions to the projecting positions and lock the lid 3 to the housing 2. With the movement of the lock mechanism 81 (movement of the lock members 84) to lock the lid 3, the lid-side support members 23 move from the lower position to the upper position. The ends of the front portions of the wafers W move up as supported by the deepest portions 24b, whereby the wafers W assume a substantially horizontal position. During the operation to lock the lid 3 to the housing 2, the ends of the front portions of the wafers W remain supported by the deepest portions 24b and the wafers W do not move relative to the lid-side support members 23.

2.3. Example of Operation when Lid 3 is Detached from Housing 2

When the lid 3 separates from the housing 2, a transition is made from the state shown in FIG. 11C via the state shown in FIG. 11B to the state shown in FIG. 11A. This will be described specifically hereinafter.

Referring to FIGS. 11C and 11B, the lock members 84 move from the projecting positions to the retracted positions, and the lock mechanism 81 unlocks the lid 3. With such motion of the lock mechanism 81, the lid-side support members 23 move from the upper position to the lower position. The ends of the front portions of the wafers W move down as supported by the deepest portions 24b.

Referring to FIGS. 11B and 11A, the lid 3 and lid-side support members 23 move together forward from the opening A. The ends of the rear portions of the wafers W slide down the lower slopes 17a to the rack members 11. At this time, each wafer W may move down automatically, or may move down by being pushed by the pushers 34. All the wafers W are placed in a substantially horizontal position on the rack members 11. During the operation for detaching the lid 3 from the housing 2, the ends of the front portions of the wafers W remain supported by the deepest portions 24b and the wafers W do not move relative to the lid-side support members 23.

When the lid 3 and lid-side support members 23 move further forward, the lid-side support members 23 will separate from the wafers W.

3. Effects of Embodiment 4

The lid-side support members 23 are movable up and down relative to the lid 3. The lid-side support members 23 move the ends of the wafers W up and down while supporting the ends of the front portions of the wafers W in the deepest portions 24b. In other words, the lid-side support members 23 raise and lower the ends of the wafers W with no sliding movement occurring between the lid-side support members 23 and the ends of the wafers W. In the operation for attaching the lid 3 to the housing 2 and the operation for detaching the lid 3 from the housing 2, therefore, a generation of particles and the like can be inhibited from occurring between the wafers W and lid-side support members 23.

Since the substrate container 1 has the lid-side lift mechanism 85, the lid-side support members 23 can be moved up and down conveniently.

The lid-side lift mechanism 85 moves the lid-side support members 23 up and down by using operation of the lock mechanism 81. The lid-side lift mechanism 85 does not therefore require a separate power source or power mechanism for moving the lid-side support members 23 up and down, such as an actuator or drive mechanism, for example. That is, the construction of the lid-side lift mechanism 85 can be simplified and reduced in size.

Embodiment 5

Embodiment 5 of this invention will be described hereinafter with reference to the drawings. A substrate container 1 according to Embodiment 5 is different from that of Embodiment 1 in that the lid-side support members 23 are substantially horizontally movable relative to the lid 3. In the following description, components identical to those of Embodiment 1 are shown with the same signs, and will not particularly be described.

1. Construction of Substrate Container

Figure 12A:
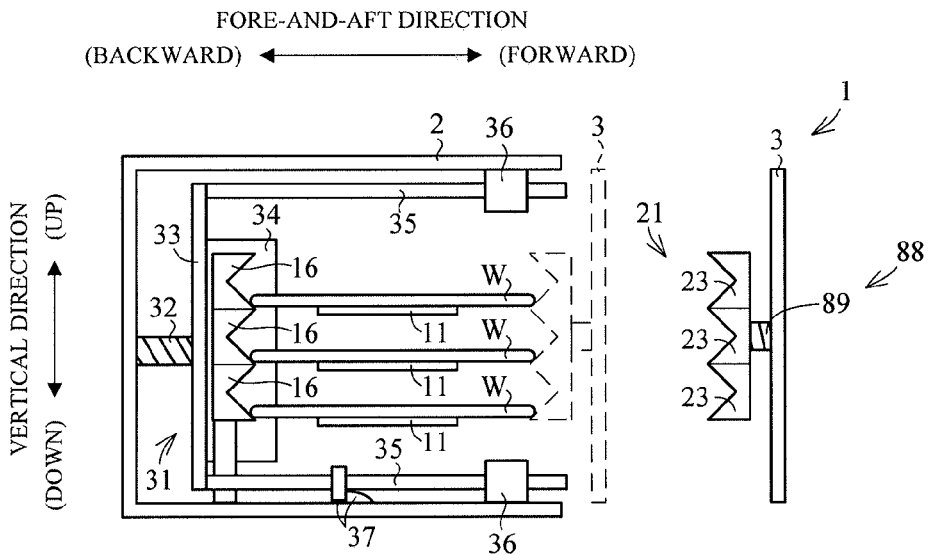
FIGS. 12A, 12B and 12C are side views showing the interior of the substrate container when attaching and detaching the lid to/from the housing.
Figure 12B:
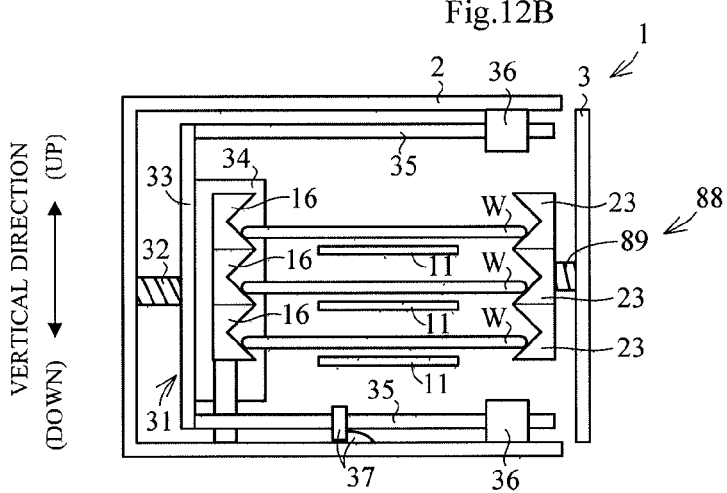
Figure 12C:
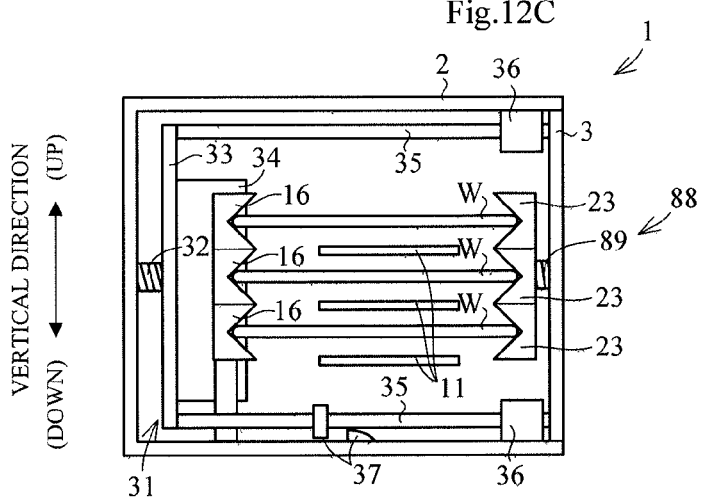

Referring to FIGS. 12A through 12C, the substrate container 1 includes a lid-side advance/withdraw mechanism 88 for moving the lid-side support members 23 in substantially horizontal directions relative to the lid 3. The substantially horizontal directions are directions in which the lid-side support members 23 move toward and away from the housing-side support members 16. The substantially horizontal directions are fore-and-aft directions, for example. The lid-side advance/withdraw mechanism 88 has a spring 89. The spring 89 is a compression spring, for example. One end of the spring 89 is fixed to the lid 3, while the other end of the spring 89 is connected to the lid-side support block 21 (lid-side support members 23). Expansion and contraction of the spring 89 permit substantially horizontal movement of the lid-side support members 23. More particularly, the spring 89 is compressed and deformed by the lid-side support members 23 moving toward the lid 3 (i.e. the lid-side support members 23 moving away from the housing-side support members 16). In a state where the spring 89 is in compressive deformation, the spring 89 presses the lid-side support members 23 in the direction to move away from the lid 3 (in other words, the spring 89 presses the lid-side support members 23 toward the housing-side support member 16).

2. Examples of Operation

2.1. State Where Lid 3 is Detached from Housing 2

Referring to FIG. 12A, the lid 3 is in a position shown in solid lines, for example. The spring 89 is not deformed but is kept at its natural length.

2.2. Example of Operation when Lid 3 is Attached to Housing 2

Referring to FIG. 12A, the lid 3 moves to a position shown in dotted lines. The lid-side support members 23 contact the wafers W.

Referring to FIG. 12B, the lid 3 moves further backward. The housing-side support members 16 and lid-side support members 23 raise the wafers W placed on the rack members 11.

Referring to FIG. 12C, the lid 3 moves to the opening A and is attached to the housing 2. The housing-side support members 16 and lid-side support members 23 support the ends of the wafers W in the deepest portions 17b and 24b. The spring 89 deforms under compressive force, and the lid-side support members 23 move toward the lid 3. The spring 89 presses the lid-side support members 23 backward.

3. Effects of Embodiment 5

The lid-side support members 23 are movable in substantially horizontal directions (e.g. in the fore-and-aft directions) relative to the lid 3. Consequently, the interval between the housing-side support members 16 and lid-side support members 23 can be changed. The housing-side support members 16 and lid-side support members 23 can therefore clamp the wafers W in between with increased convenience.

Since the substrate container 1 includes the lid-side advance/withdraw mechanism 88, the interval between the housing-side support members 16 and lid-side support members 23 (strictly speaking, the interval between the deepest portions 17b and the deepest portions 24b) can be brought into agreement with the outside dimension of the wafers W. Consequently, even where variations or errors occur with the outside dimension of the wafers W, the housing-side support members 16 and lid-side support members 23 can conveniently clamp the wafers W in between.

The lid-side advance/withdraw mechanism 88 has the spring 89. The spring 89 can press the lid-side support members 23 toward the housing-side support members 16. Thus, the lid-side advance/withdraw mechanism 88 can make the interval between the housing-side support members 16 and lid-side support member 23 follow the outside dimension of the wafers W easily. Further, the housing-side support members 16 and lid-side support members 23 can clamp the wafers W in between with appropriate strength.

Embodiment 6

Embodiment 6 of this invention will be described hereinafter with reference to the drawings. A substrate container 1 according to Embodiment 6 is different from that of Embodiment 1 in that the lid-side support members 23 are vertically movable and movable fore and aft relative to the lid 3. In the following description, components identical to those of Embodiment 1 are shown with the same signs, and will not particularly be described.

1. Construction of Substrate Container

Referring to FIGS. 13A through 13D, the substrate container 1 includes a lid-side lift mechanism 91, a lid-side advance/withdraw mechanism 95 and a lid-side guide mechanism 97. The lid-side lift mechanism 91 displaces lid-side support members 23 in a vertical direction relative to the lid 3. The lid-side advance/withdraw mechanism 95 displaces the lid-side support members 23 in a fore-and-aft direction relative to the lid 3. The lid-side guide mechanism 97 guides the lid-side support members 23 in the vertical direction and fore-and-aft direction.

The lid-side lift mechanism 91 is interlocked with the motions of the lid 3 in attaching and detaching to/from the housing 2 to move the lid-side support members 23 up and down relative to the lid 3. Specifically, with the motion of the lid 3 at an attaching time, the lid-side lift mechanism 91 raises the lid-side support members 23 relative to the lid 3. With the motion of the lid 3 at a detaching time, the lid-side lift mechanism 91 lowers the lid-side support members 23 relative to the lid 3. The construction of the lid-side lift mechanism 91 will be described hereinafter.

The lid-side lift mechanism 91 includes a connecting plate 92. The connecting plate 92 is fixed to the lid-side support block 21 (lid-side support members 23). The connecting plate 92 extends downward from the lid-side support block 21. The connecting plate 92 is movable with the lid-side support members 23.

Figure 14A:
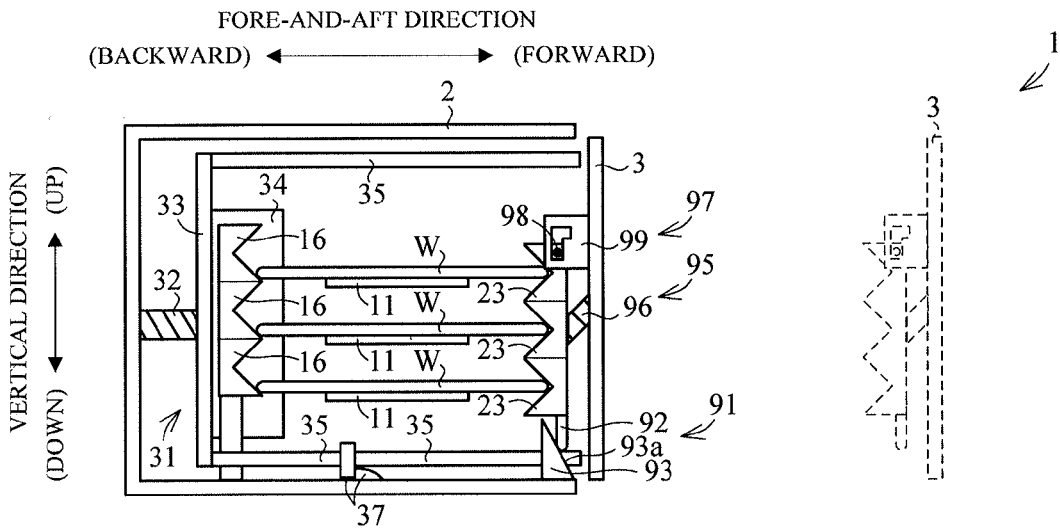
FIGS. 14A, 14B and 14C are side views showing the interior of a substrate container when attaching and detaching the lid to/from the housing.

Referring to FIG. 14A, the lid-side lift mechanism 91 further includes a fixed base 93. The fixed base 93 is fixed inside the housing 2. Specifically, the fixed base 93 is mounted on the bottom plate 5 to be immovable relative to the housing 2. The fixed base 93 is disposed in a position capable of contacting the connecting plate 92. The fixed base 93 has a sloping surface 93a for contacting and guiding the connecting plate 92. The sloping surface 93a is inclined relative to the fore-and-aft direction. In this embodiment, the sloping surface 93a is inclined upward and backward.

The lid-side advance/withdraw mechanism 95 includes a spring 96. The spring 96 is a compression spring, for example. One end of the spring 96 is fixed to the lid 3, and the other end of the spring 96 is connected to the lid-side support block 21 (lid-side support members 23). The spring 96 is extended, contracted and bent following movements of the lid-side support members 23. Specifically, when the lid-side support members 23 move in the fore-and-aft direction, the spring 96 is extended or contracted. When the lid-side support members 23 move in the vertical direction, the spring 96 is bent.

The lid-side guide mechanism 97 includes connecting pins 98 and guide members 99. The connecting pins 98 are fixed to the lid-side support block 21 (lid-side support members 23). The guide members 99 are fixed to the lid 3. Each guide member 99 has a bore for receiving the connecting pin 98. The bore is bent to be substantially L-shaped. A part of the bore extends parallel to the vertical direction, while the other part of the bore extends parallel to the fore-and-aft direction. Each connecting pin 98 is inserted in the bore. With the connecting pins 98 sliding along the bores of the guide members 99, the lid-side support members 23 move up and down and fore and aft relative to the lid 3.

Figure 13D:
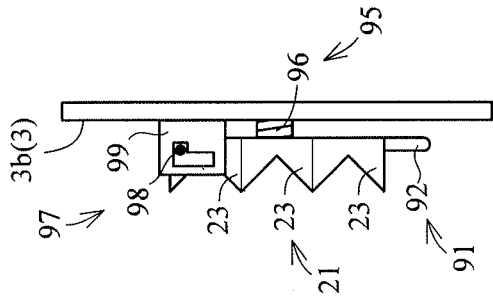
FIGS. 13B, 13C and 13D are side views showing the lid according to Embodiment 6.
Figure 13C:
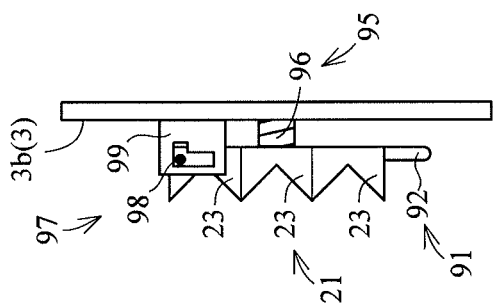
Figure 13B:
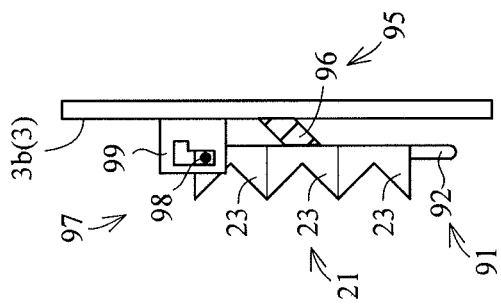
Figure 13A:
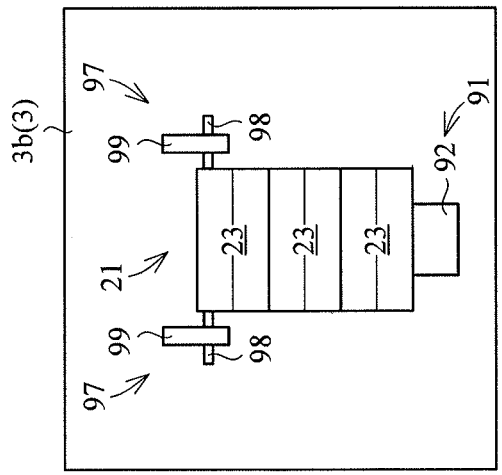
FIG. 13A is a rear view showing a lid according to Embodiment 6.

Here, the positions of the lid-side support members 23 shown in FIGS. 13B, 13C and 13D are called the "lower position", "upper position" and "contract position", respectively. The lower position is located right under the upper position, and is lower than the upper position. The contract position is at the same height as the upper position. The lid-side guide mechanism 97 guides the lid-side support members 23 in the vertical direction between the lower position and the upper position. The lid-side guide mechanism 97 also guides the lid-side support members 23 in the fore-and-aft direction between the upper position and the contract position. As shown in FIGS. 13B and 13C, therefore, the lid-side support members 23 are movable in the vertical direction. As shown in FIGS. 13C and 13D, the lid-side support members 23 are movable in the fore-and-aft direction.

When the lid 3 faces the opening A and the lid-side support members 23 are in the lower position, the position of deepest portion 24b of the lid-side support member 23a is at a height equivalent to the plane of contact of the rack member 11a. When the lid 3 faces the opening A and the lid-side support member 23a is in either the upper position or the contract position, the position of the deepest portion 24b of the lid-side support member 23a is at a height equivalent to the deepest portion 17b of the housing-side support member 16a, and higher than the plane of contact of the rack member 11a.

2. Examples of Operation

2.1. State Where Lid 3 is Detached from Housing 2

Referring to FIG. 14A, the lid 3 is in a position shown in dotted lines, for example. The lid-side support members 23 are in the lower position.

2.2. Example of Operation when Lid 3 is Attached to Housing 2

Referring to FIG. 14A, the lid 3 moves to a position shown in solid lines. The deepest portions 24b of the lid-side support members 23 contact the ends of the front portions of the wafers W.

Figure 14B:
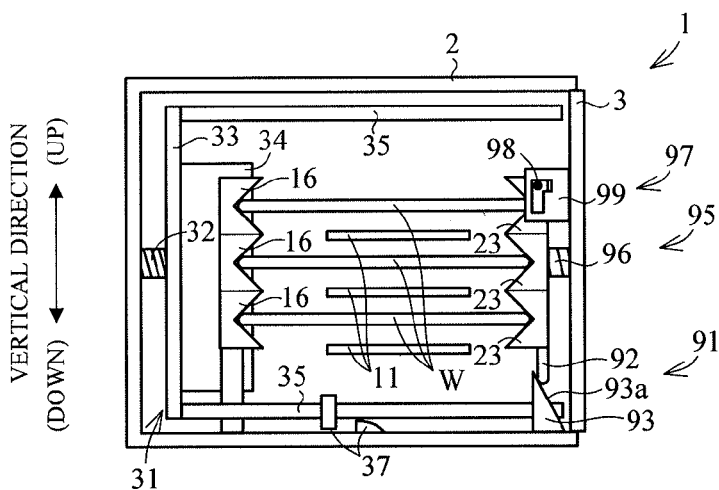

Referring to FIG. 14B, when the lid 3 moves further backward, the lid-side support members 23 will move backward. Since the connecting plate 92 moves up along the sloping surface 93a of the fixed base 93 at this time, the lid-side support members 23 move upward while moving backward. Consequently, the lid-side support members 23 move from the lower position to the upper position. With such movement of the lid-side support members 23, the lid-side support members 23, supporting the wafers W, raise the ends of the front portions of the wafers W while pushing the wafer W backward. The ends of the rear portions of the wafers W move up along the lower slopes 17a. Consequently, the entire wafers W move up while maintaining a substantially horizontal position. Eventually the ends of the rear portions of the wafers W reach the deepest portions 17b.

Figure 14C:
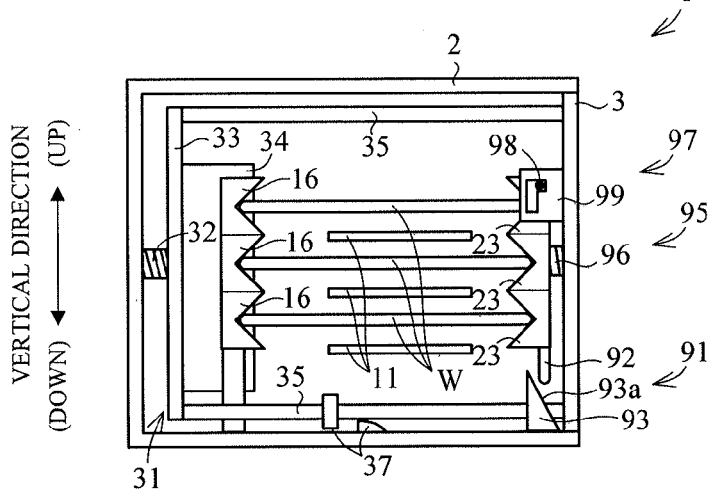

Referring to FIG. 14C, the lid 3 moves to the opening A and is attached to the housing 2. The lid-side support members 23 are pressed backward by the lid 3, and at the same time receive reaction force from the wafers W. Consequently, the lid-side support members 23 move from the upper position to the contract position, and the spring 96 deforms under compressive force. The spring 96 presses the lid-side support members 23 in a direction away from the lid 3 (in other words, a direction toward the housing-side support members 16).

Throughout the above operation for attaching the lid 3 to the housing 2, the ends of the front portions of the wafers W are supported by the deepest portions 24*b*. The wafers W and lid-side support members 23 do not slide relative to each other.

2.3. Example of Operation when Lid 3 is Detached from Housing 2

When the lid 3 separates from the housing 2, a transition is made from the state shown in FIG. 14C via the state shown in FIG. 14B to the state shown in FIG. 14A. When the lid 3 separates from the housing 2, the wafers W move down to the rack members 11 while maintaining the substantially horizontal position. During the operation of the lid 3 separating from the housing 2, the wafers W do not slide relative to the lid-side support members 23.

3. Effects of Embodiment 6

The lid-side support members 23 can move the ends of the wafers W up and down without sliding relative to the wafers W. This can prevent particle generation between the wafers W and lid-side support members 23. Further, the lid-side support members 23 are movable in the fore-and-aft direction relative to the lid 3. The housing-side support members 16 and lid-side support members 23 can therefore clamp the wafers W in between conveniently.

The lid-side lift mechanism 91 moves the lid-side support members 23 up and down, using the fore-and-aft motions of the lid 3 relative to the housing 2. The construction of the lid-side lift mechanism 91 can therefore be simplified and reduced in size.

The substrate container 1 includes the lid-side guide mechanism 97. This enables the lid-side support members 23 to move in appropriate directions. Specifically, the moving directions of the lid-side support members 23 relative to the lid 3 can be limited to the vertical direction and fore-and-aft direction.

This invention is not limited to the foregoing embodiments, but may be modified as follows:

(1) In each embodiment described hereinbefore, the plurality of housing-side support members 16 are formed integrally. The invention is not limited to this. For example, each housing-side support member 16 may be separate form the others. The construction of the lid-side support members 23 may be changed similarly.

(2) In Embodiment 1 described hereinbefore, the lower slopes 17*a* of the housing-side support members 16 are in contact with the wafers W in the state where the lid 3 is detached from the housing 2. The invention is not limited to this. That is, in the state where the lid 3 is detached from the housing 2, the entire housing-side support members 16 may be separate from the wafers W.

(3) In each embodiment described hereinbefore, the plurality of housing-side support members 16 are arranged in a row in the vertical direction. The invention is not limited to this. The plurality of housing-side support members 16 may be arranged in a plurality of rows in the vertical direction. The plurality of housing-side support members 16 may be arranged zigzag in the vertical direction. The arrangement of the lid-side support members 23 may be changed similarly.

(4) In each embodiment described hereinbefore, an appropriate change may be made in the section or the period in which the moving mechanism 31, 51 or 61 is in contact with the wafers W that do not automatically move down to the rack members 11. Further, an appropriate change may be made in the section or the period in which the moving mechanism 31, 51 or 61 push the wafers W that do not automatically move down to the rack members 11.

The moving mechanism 31, 51 or 61 may continue to be in contact with the wafers W, or may continue to push the wafers W, until the wafers W are placed in a substantially horizontal position on the rack members 11, for example. This will enable the moving mechanism 31, 51 or 61 to place the wafers W that do not automatically move down to the rack members 11, reliably on the rack members 11. The moving mechanism 31, 51 or 61 will also be able to uniform the positions of the wafers W on the rack members 11.

Alternatively, the moving mechanism 31, 51 or 61 may be in contact with the wafers W at least until the wafers W disengage from the deepest portions 17*b*. For example, the moving mechanism 31, 51 or 61 may be in contact with the wafers W until the wafers W disengage from the deepest portions 17*b*, and separate from the wafers W after the wafers W disengage from the deepest portions 17*b* and before the wafers W are placed on the rack members 11. In this modified embodiment also, the moving mechanism 31, 51 or 61 can give a start to the wafers W for moving down to the rack members 11, and place the wafers W in a substantially horizontal position on the rack members 11. The movable range of the moving mechanism 31, 51 or 61 can also be reduced.

(5) In Embodiment 1 described hereinbefore, the guide members 36 indirectly limit the moving direction of pushers 34 by guiding the rods 35. The invention is not limited to this. The guide members 36 may directly contact the pushers 34 to limit the moving direction of the pushers 34 directly.

(6) In Embodiment 1 described hereinbefore, the restricting member 37 indirectly specifies a movable range and a forefront position of the pushers 34 by specifying a forefront position of the rods 35. The invention is not limited to this. The restricting member 37 may directly contact the pushers 34 to specify a movable range and a forefront position of the pushers 34 directly.

(7) In Embodiments 1 through 3 and 5 described hereinbefore, when the lid 3 is attached to the housing 2, the lid-side support members 23 are opposed to the housing-side support members 16 at substantially the same heights, with the deepest portions 17*b* and deepest portions 24*b* at substantially the same heights. The invention is not limited to this. The deepest portions 17*b* and 24*b* may be at different heights as long as the housing-side support members 16 and lid-side support members 23 can clamp the wafers W in between in the state where the lower surfaces of the wafers W are not in contact with the rack members 11.

For example, the positions of the deepest portions 24*b* of the lid-side support members 23 may be at heights equivalent to the planes of contact of the rack members 11. The lid-side lift mechanisms 85 and 91 may be omitted from Embodiments 4 and 6, for example. In these modified embodiments, when the housing-side support members 16 and lid-side support members 23 clamp the wafers W in between, the wafers W assume tilted positions. However, the housing-side support members 16 and lid-side support members 23 can hold the wafers W as raised from the rack members 11. These modified embodiments can therefore protect the wafers W appropriately.

(8) Embodiment 6 described hereinbefore provides the lid-side lift mechanism 91, lid-side advance/withdraw mechanism 95 and lid-side guide mechanism 97. The invention is not limited to this. For example, the lid-side advance/withdraw mechanism 95 may be omitted. In this modified embodiment, the direction in which the lid-side guide mechanism 97 guides the lid-side support members 23 may be changed to the vertical direction only. According to this modified embodiment, the lid-side support members 23 can move up and down relative to the lid 3.

Alternatively, the lid-side lift mechanism 91 of Embodiment 6 may be replaced with the lid-side lift mechanism 85 of Embodiment 4. That is, the substrate container 1 according to this modified embodiment includes the lid-side lift mechanism 85 illustrated in Embodiment 4, and the lid-side advance/withdraw mechanism 95 and lid-side guide mechanism 97 illustrated in Embodiment 6.

Reference is made to FIGS. 15A through 15D. In this modified embodiment, the spring 96 of the lid-side advance/withdraw mechanism 95 is mounted between the rack 87 of the lid-side lift mechanism 85 and the lid-side support block 21 (lid-side support members 23). One end of the spring 96 is connected to the rack 87, while the other end of the spring 96 is connected to the lid-side support block 21 (lid-side support members 23). The guide members 99 of the lid-side guide mechanism 97 are fixed to the rack 87. The direction in which the lid-side guide mechanism 97 guides the lid-side support members 23 is changed to the fore-and-aft direction only. In such modified embodiment also, the lid-side support members 23 are movable up and down and fore and aft relative to the lid 3. According to this modified embodiment, the lid-side support members 23 are movable to the four positions shown in FIGS. 15A through 15D. The lid-side support members 23 can therefore support the wafers W with increased aptness.

(9) In each embodiment described hereinbefore, the substrate container 1 may further include a shield member for blocking off atmosphere in the housing 2. Alternatively, the substrate container 1 may further include a shield member for keeping clean the space around the wafers W in the housing 2.

For example, a shield member may block atmosphere between the space in which the wafers W are supported and the space in which at least part of the moving mechanism 31, 51 or 61 is installed. According to this, particles generated by the moving mechanism 31 can be prevented from entering the space in which the wafers W are supported. As a result, particles can be effectively prevented from adhering to the wafers W.

Figure 16:
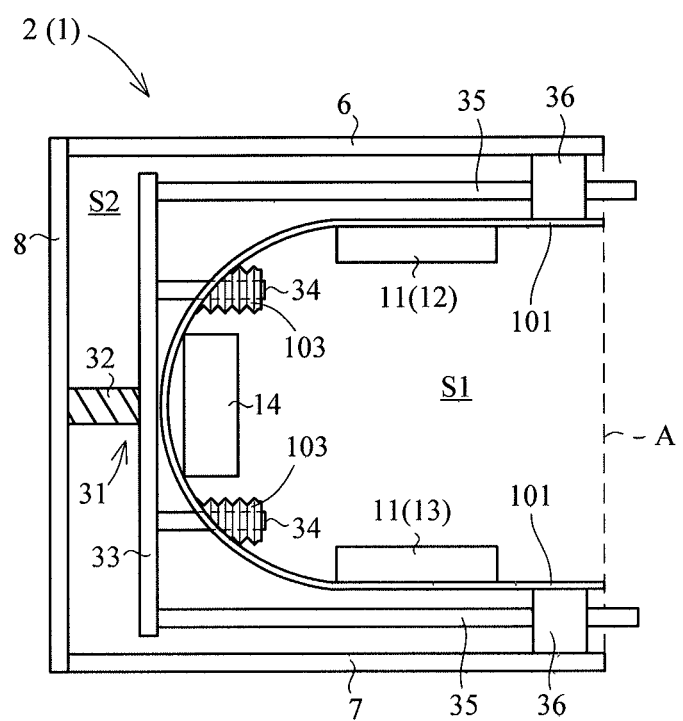
FIG. 16 is a plan view showing the interior of a housing according to a modified embodiment.

Referring to FIG. 16, the substrate container 1 includes a partition 101 and bellows 103 as shield members. The partition 101 separates a space S1 in which the wafers W are supported from a space S2 in which a large part of the moving mechanisms 31 is installed. The partition 101 has openings formed therein for inserting the pushers 34. The pushers 34 are installed to penetrate the partition 101. The bellows 103 are attached to the pushers 34. The bellows 103 have proximal ends thereof attached to the partition 101. The bellows 103 are extendible and contractible with the fore and aft movements of the pushers 34. The partition 101 and bellows 103 block off atmospheres in the space S1 and space S2.

As another example, a shield member may block atmosphere between the space in which the wafers W are supported and a space in which at least either of the guide members 36 or the restricting members 37 or 57 are installed. Or, in the state where lid 3 is attached to the housing 2, a shield member may block off atmosphere between the space in which the wafers W are supported and a space in which at least one of the various mechanisms 81, 85, 88, 91, 95 and 97 attached to the lid 3 is installed.

(10) In each embodiment described hereinbefore, the substrate container 1 may further include gas supply inlets for supplying a gas into the housing 2 and gas exhaust outlets for exhausting the gas from the housing 2. Preferably, the gas supply inlets and gas exhaust outlets are arranged so that the gas flow backward from the wafers W toward the moving mechanism 31, 51 or 61. For example, the gas supply inlets may be arranged forward of the gas exhaust outlets. Or the gas supply inlets may be arranged below the gas exhaust outlets. According to this, particles generated by the moving mechanism 31, 51 or 61 can be discharged outside the housing 2 without passing through the space in which the wafers W are supported.

Figure 17:
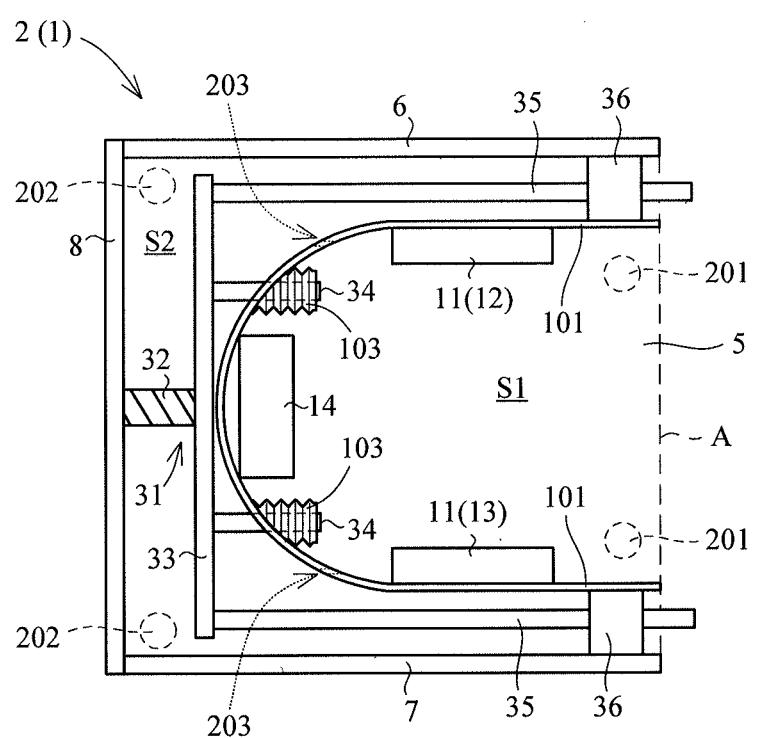
FIG. 17 is a plan view showing the interior of a housing according to a modified embodiment.

FIG. 17 is a plan view of the substrate container 1 according to the above modified embodiment. A plurality of gas supply inlets 201 are formed in positions of the bottom plate 5 adjacent the opening A to communicate with the space S1. These gas supply inlets 201 are connected to the gas supply port 64 (see Embodiment 3). A plurality of gas exhaust outlets 202 are formed in positions of the bottom plate 5 adjacent the rear wall 8 to communicate with the space S2. These gas exhaust outlets 202 are connected to the gas exhaust port 66 (see Embodiment 3).

Further, a plurality of communicating bores 203 are formed in rearward locations of the partition 101 to be aligned in the vertical direction. The space S1 and space S2 communicate with each other through these communicating bores 203.

When the substrate container 1 is placed on a support table 44, the gas supply port 64 is connected to the gas supply port 72 of the external device 70, and the gas exhaust port 66 is connected to the gas exhaust port 75 of external device 70. The external device 70 supplies the gas such as an inert gas to the substrate container 1 through the gas supply port 72, and exhausts the gas from the substrate container 1 through the gas exhaust port 75. The gas supplied to the substrate container 1 flows through the gas supply inlets 201 into the space S1. The gas in the space S2 is exhausted through the gas exhaust outlets 202 and gas exhaust port 66 and outside the substrate container 1 (to the external device 120). Consequently, gas currents are formed inside the housing 2, which flow from the space S1 through the communicating bores 203 into the space S2. The direction of these gas currents is substantially backward. As a result, the gas in the space S1 is discharged toward the space S2. However, the gas in the space S2 is inhibited from flowing into the space S1.

(11) Embodiment 3 described hereinbefore illustrates the air cylinder 62 as an example of gas-operated device. The invention is not limited to this. For example, the gas-operated device may be balloons or air bags which are inflatable and deflatable by supply and exhaust of a gas.

Figure 18:
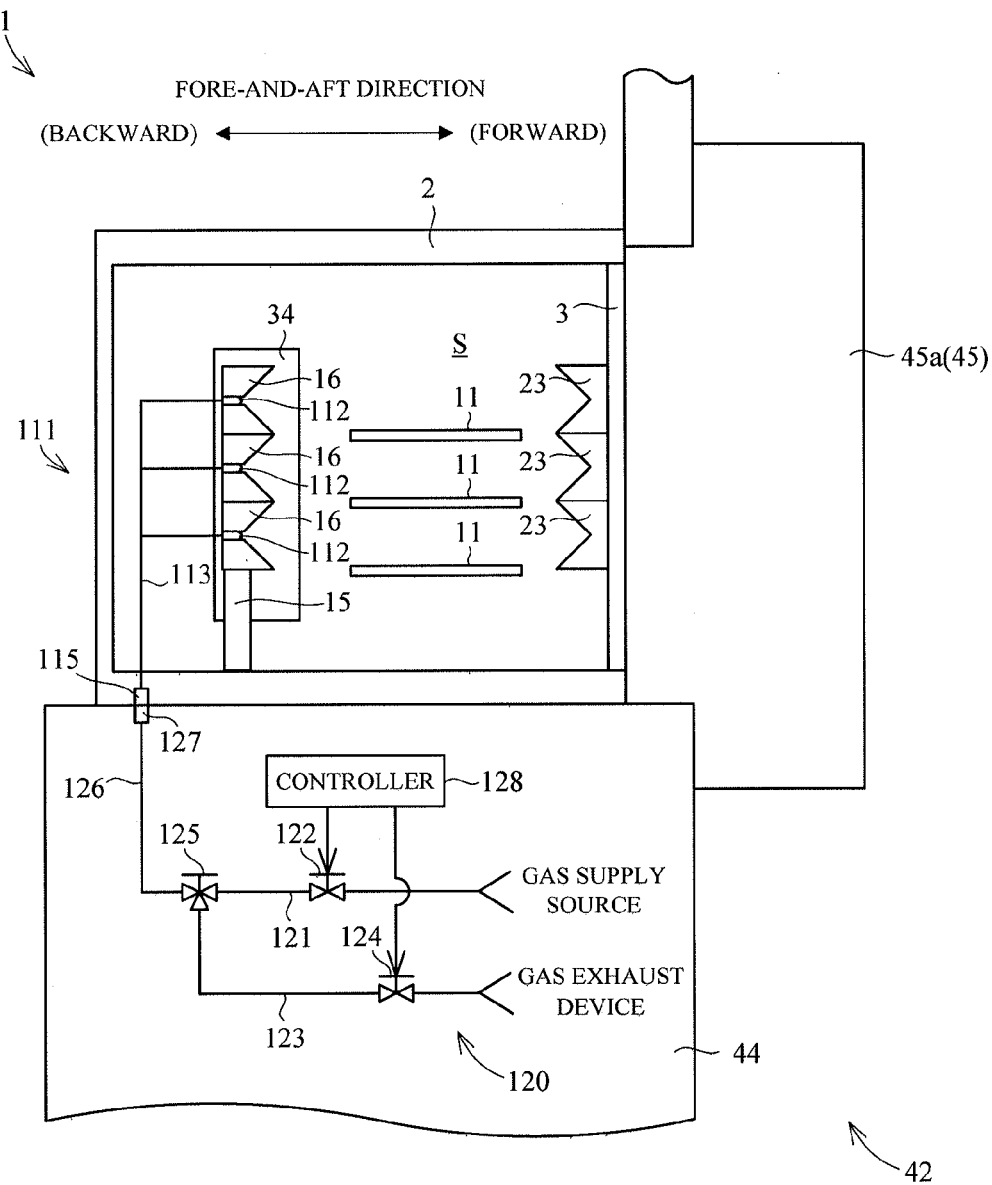
FIG. 18 is an enlarged side view showing a substrate container and a load port apparatus according to a modified embodiment.

Referring to FIG. 18, a substrate container 1 according to this modified embodiment includes a moving mechanism 111. The moving mechanism 111 has a plurality of balloons 112. The balloons 112 are arranged in the respective deepest portions 17b. FIG. 18 shows the balloons 112 in a deflated state. The balloons 112 are an example of the gas-operated device in this invention.

The moving mechanism 111 further includes a gas flow path 113 and a connection port 115. One end of the gas flow path 113 is connected to the balloons 112. The gas flow path 113 supplies and exhausts the gas to/from the balloons 112. At least part of the gas flow path 113 may be formed of piping. Or at least part of the gas flow path 113 may be formed inside the housing-side support members 16. The other end of the gas flow path 113 is connected to the connection port 115. The connection port 115 is connectable to an external device 120.

The external device 120 is provided in the load port section 42, for example. The external device 120 includes a gas supply pipe 121, a supply valve 122, a gas exhaust pipe 123, an exhaust valve 124, a three-way valve 125, a gas common pipe 126, a gas port 127 and a controller 128. One end of the gas supply pipe 121 is connected to a gas supply source. The supply valve 122 is mounted on an intermediate part of the gas supply pipe 121. One end of the gas exhaust pipe 123 is connected to a gas exhaust device. The exhaust valve 124 is mounted on an intermediate part of the gas exhaust pipe 123. The other end of the gas supply pipe 121 and the other end of the gas exhaust pipe 123 are connected to the three-way valve 125. Further, one end of the gas common pipe 126 is connected to the three-way valve 125. The three-way valve 125 selectively connects the gas supply pipe 121 and gas exhaust pipe 123 to the gas common pipe 126. The other end of the gas common pipe 126 is connected to the gas port 127. The gas port 127 is connectable to the connection port 115. The controller 128 operates the supply valve 122, exhaust valve 124 and three-way valve 125. Consequently, the controller 128 controls the gas supply and exhaust to/from the balloons 112.

Figure 19:
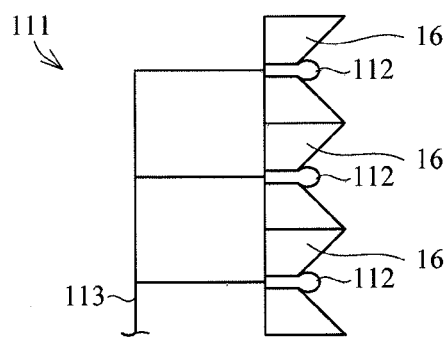
FIG. 19 is an enlarged side view showing housing-side support members, a substrate container and a load port apparatus according to a modified embodiment.

When the controller 128 causes the gas to be supplied to the balloons 112, as shown in FIG. 19, the balloons 112 will become inflated. The balloons 112, when inflated, can move forward the wafers W supported by the deepest portions 17*b* to disengage the wafers W from the deepest portions 17*b*. The moving mechanism 111 can therefore place the wafers W in a substantially horizontal position on the rack members 11. As a result, in this modified embodiment also, the transport mechanism 47 can unload the wafers W appropriately from the substrate container 1.

When the controller 128 causes the gas to be exhausted from the balloons 112, as shown in FIG. 18, the balloons 112 will become deflated. When the balloons 112 deflate, the housing-side support members 16 can support the wafers W in the deepest portions 17*b*.

(12) In Embodiment 6 described hereinbefore, the lid-side guide members 99 are formed separately from the lid 3. The invention is not limited to this. That is, the lid 3 and lid-side guide members 99 may be integrated. For example, the lid 3 may have grooves formed therein for sliding the connecting pins 98. For example, the grooves may be formed inward of the lid 3 (specifically, in positions dented from the rear surface 3*b* of the lid 3). Further, the lid 3 may have a recess formed in the rear surface 3*b* thereof for receiving at least part of the lid-side support members 23. According to such modified embodiment, the lid 3 and lid-side entire support members 23 as a whole may have a reduced thickness.

(13) In Embodiment 1, the moving mechanism 31 includes the spring 32 for pressing the movable plate 33 and pushers 34 forward. The invention is not limited to this. For example, the moving mechanism 31 may include a link mechanism for interlocking the movement of the lid 3 and the fore and aft movement of the pushers 34 without using the spring 32. Specifically, the link mechanism interlocks the backward movement of the lid 3 relative to the housing 2 and the backward movement of the pushers 34, and interlocks the forward movement of the lid 3 relative to the housing 2 and the forward movement of the pushers 34. This modified embodiment can dispense with the spring 32, for example.

(14) In each embodiment described hereinbefore, each load port device 420, 421 or 422 has one support table 44. The invention is not limited to this. That is, each load port device may be modified to include a plurality of support tables. In the foregoing embodiments, each load port device 420, 421 or 422 allows one substrate container 1 to be placed thereon. The invention is not limited to this. That is, a change may be made to the load port devices each allowing a plurality of substrate containers 1 to be placed thereon.

(15) Embodiments 1-6 described hereinbefore and each of the modified embodiments described in (1) to (14) above may be further varied as appropriate by replacing or combining each component with a component of another embodiment or a component of another modified embodiment.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate container comprising:
a housing capable of accommodating substrates therein, and having an opening in a front plane thereof;
rack members arranged inside the housing for contacting lower surfaces of the substrates and supporting the substrates in a substantially horizontal position;
housing-side support members arranged inside the housing for supporting ends of the substrates;
a moving mechanism mounted inside the housing for moving the substrates;
a lid detachable from and attachable to the housing to open and close the opening; and
lid-side support members attached to a rear surface of the lid for supporting ends of the substrates;
wherein:
the housing-side support members have binding portions for supporting the ends of the substrates to be immovable upward;
in a state where the lid is attached to the housing, the housing-side support members and the lid-side support members clamp the ends of the substrates in between, with the lower surfaces of the substrates out of contact with the rack members, and the housing-side support members support the ends of the substrates in the binding portions; and
when the lid detaches from the housing, the moving mechanism moves the substrates supported in the binding portions to disengage the ends of the substrates from the binding portions, and places the substrates in the substantially horizontal position on the rack members.

2. The substrate container according to claim 1, wherein:
the moving mechanism includes an elastically deformable elastic member;
in the state where the lid is attached to the housing, the elastic member is elastically deformed for allowing the substrates to be supported in the binding portions; and
when the lid detaches from the housing, the elastic member is restored to move the substrates.

3. The substrate container according to claim 2, wherein the moving mechanism includes link members for interlocking movement of the lid relative to the housing and elastic deformation of the elastic member.

4. The substrate container according to claim 2, wherein the elastic member can directly contact the substrates.

5. The substrate container according to claim 2, wherein the moving mechanism further includes contact members connected to the elastic member to be capable of directly contacting the substrates.

6. The substrate container according to claim 5, comprising guide members for limiting a moving direction of the contact members to one direction.

7. The substrate container according to claim 1, comprising a restricting member for specifying a movable range of the moving mechanism to fix a range in which the moving mechanism moves the substrates.

8. The substrate container according to claim 1, wherein the moving mechanism includes:
a gas-operated device operable by gas supply and exhaust;
a connection port connectable to an external device of the substrate container; and
a gas flow path for connecting the gas-operated device and the connection port.

9. The substrate container according to claim 1, wherein the lid-side support members are movable up and down relative to the lid.

10. The substrate container according to claim 9, comprising a lid-side lift mechanism for moving the lid-side support members up and down relative to the lid.

11. The substrate container according to claim 10, comprising a lock mechanism for locking the lid to the housing;
wherein the lid-side lift mechanism is interlocked to the lock mechanism to move the lid-side support members up and down relative to the lid in response to operation of the lock mechanism.

12. The substrate container according to claim 10, wherein the lid-side lift mechanism is configured to move the lid-side support members up and down relative to the lid in response to motions of the lid attaching to and detaching from the housing.

13. The substrate container according to claim 1, wherein the lid-side support members are substantially horizontally movable relative to the lid.

14. The substrate container according to claim 1, wherein the lid-side support members are formed of an elastic resin.

15. A load port apparatus comprising:
a support table for receiving a substrate container placed thereon; and
a lid opening and closing mechanism for opening and closing a lid of the substrate container placed on the support table;
the substrate container having:
a housing capable of accommodating substrates therein, and having an opening in a front plane thereof;
rack members arranged inside the housing for contacting lower surfaces of the substrates and supporting the substrates in a substantially horizontal position;
housing-side support members arranged inside the housing for supporting ends of the substrates;
a moving mechanism mounted inside the housing for moving the substrates
a lid detachable from and attachable to the housing to open and close the opening; and
lid-side support members attached to a rear surface of the lid for supporting ends of the substrates;
wherein:
the housing-side support members have binding portions for supporting the ends of the substrates to be immovable upward;
in a state where the lid is attached to the housing, the housing-side support members and the lid-side support members clamp the ends of the substrates in between, with the lower surfaces of the substrates out of contact with the rack members, and the housing-side support members support the ends of the substrates in the binding portions; and
when the lid detaches from the housing, the moving mechanism moves the substrates supported in the binding portions to disengage the ends of the substrates from the binding portions, and places the substrates in the substantially horizontal position on the rack members.

16. A substrate treating apparatus comprising:
a support table for receiving a substrate container placed thereon;
a lid opening and closing mechanism for opening and closing a lid of the substrate container placed on the support table;
a treating unit for treating substrates; and
a transport mechanism for unloading the substrates from the substrate container placed on the support table, and loading the substrates into the treating unit;
the substrate container having:
a housing capable of accommodating substrates therein, and having an opening in a front plane thereof;
rack members arranged inside the housing for contacting lower surfaces of the substrates and supporting the substrates in a substantially horizontal position;
housing-side support members arranged inside the housing for supporting ends of the substrates;
a moving mechanism mounted inside the housing for moving the substrates
a lid detachable from and attachable to the housing to open and close the opening; and
lid-side support members attached to a rear surface of the lid for supporting ends of the substrates;
wherein:
the housing-side support members have binding portions for supporting the ends of the substrates to be immovable upward;
in a state where the lid is attached to the housing, the housing-side support members and the lid-side support members clamp the ends of the substrates in between, with the lower surfaces of the substrates out of contact with the rack members, and the housing-side support members support the ends of the substrates in the binding portions; and
when the lid detaches from the housing, the moving mechanism moves the substrates supported in the binding portions to disengage the ends of the substrates from the binding portions, and places the substrates in the substantially horizontal position on the rack members.

* * * * *